(12) United States Patent
Machida

(10) Patent No.: US 11,098,958 B2
(45) Date of Patent: Aug. 24, 2021

(54) LOOP-TYPE HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 166 days.

(21) Appl. No.: 16/657,406

(22) Filed: Oct. 18, 2019

(65) Prior Publication Data

US 2020/0124353 A1 Apr. 23, 2020

(30) Foreign Application Priority Data

Oct. 23, 2018 (JP) .............................. JP2018-199516

(51) Int. Cl.
*F28D 15/02* (2006.01)
*F28D 15/04* (2006.01)

(52) U.S. Cl.
CPC ....... *F28D 15/0266* (2013.01); *F28D 15/043* (2013.01)

(58) Field of Classification Search
CPC .. F28D 15/0266; F28D 15/043; F28D 15/046; H01L 23/427
USPC .................................................... 165/104.21
See application file for complete search history.

(56) References Cited

U.S. PATENT DOCUMENTS

| | | | | |
|---|---|---|---|---|
| 4,312,402 A * | 1/1982 | Basiulis | ............... | H01L 35/00 165/104.22 |
| 5,725,049 A * | 3/1998 | Swanson | ............... | F28D 15/043 122/366 |
| 5,944,092 A * | 8/1999 | Van Oost | ............... | F28D 15/043 165/104.26 |
| 6,227,288 B1 * | 5/2001 | Gluck | ................... | F28D 15/043 165/104.26 |
| 2004/0182550 A1 * | 9/2004 | Kroliczek | ............. | F25B 23/006 165/104.26 |
| 2004/0206479 A1 | 10/2004 | Kroliczek et al. | | |
| 2007/0267180 A1 * | 11/2007 | Asfia | ..................... | F28D 15/046 165/104.26 |

(Continued)

FOREIGN PATENT DOCUMENTS

JP 6146484 5/2017

OTHER PUBLICATIONS

European Search Report dated Mar. 13, 2020, 7 pages.

*Primary Examiner* — Justin M Jonaitis
(74) *Attorney, Agent, or Firm* — Rankin, Hill & Clark LLP

(57) ABSTRACT

A loop-type heat pipe includes an evaporator configured to vaporize an operating fluid, a condenser configured to condense the operating fluid, a liquid pipe configured to connect the evaporator and the condenser, a vapor pipe configured to connect the evaporator and the condenser and to form a loop together with the liquid pipe, a first porous body provided in the evaporator, and a second porous body provided in the liquid pipe. A connection region between the evaporator and the liquid pipe includes a first porous extension part extending from one of the first porous body and the second porous body toward the other, and a space part in contact with the first porous extension part. A leading end of the first porous extension part is inserted in a first concave part formed in the other of the first porous body and the second porous body.

20 Claims, 14 Drawing Sheets

(56) References Cited

U.S. PATENT DOCUMENTS

| | | | |
|---|---|---|---|
| 2008/0283223 A1* | 11/2008 | Chang .................. | F28D 15/043 165/104.26 |
| 2010/0307721 A1* | 12/2010 | Wang ................. | F28D 15/0266 165/104.26 |
| 2016/0259383 A1* | 9/2016 | Shioga .................... | G06F 1/203 |

* cited by examiner

LOOP-TYPE HEAT PIPE

CROSS-REFERENCE TO RELATED APPLICATIONS

This application is based upon and claims the benefit of priority from prior Japanese patent application No. 2018-199516, filed on Oct. 23, 2018, the entire contents of which are incorporated herein by reference.

TECHNICAL FIELD

The present disclosure relates to a loop-type heat pipe.

BACKGROUND ART

As a device configured to cool heat generation components such as a CPU (Central Processing Unit) mounted on an electronic device, a heat pipe is known. The heat pipe is a device configured to transport heat by using a phase change of an operating fluid.

As the heat pipe, a loop-type heat pipe may be exemplified which includes an evaporator configured to vaporize the operating fluid by heat of the heat generation component and a condenser configured to cool and condense the vaporized operating fluid and the evaporator and the condenser are connected by a liquid pipe and a vapor pipe forming a loop-shaped flow path. In the loop-type heat pipe, the operating fluid flows in one direction along the loop-shaped flow path.

Also, in the evaporator and the liquid pipe of the loop-type heat pipe, a porous body is respectively provided, so that the operating fluid in the liquid pipe is guided to the evaporator by capillary force generated in the porous body and the vapor is suppressed from flowing back to the liquid pipe from the evaporator (for example, refer to PTL 1).

[PTL 1]

Japanese Patent No. 6,146,484

However, a connection region between the evaporator and the liquid pipe is a space, and the porous body provided in the evaporator and the porous body provided in the liquid pipe are not present in the connection region. That is, the porous body provided in the evaporator and the porous body provided in the liquid pipe are disconnected, i.e., are not connected in the connection region.

For this reason, liquid circulation from the liquid pipe into the evaporator is deteriorated, and an unnecessary liquid reservoir is generated in the connection region, so that liquid introduction from the liquid pipe into the evaporator may be obstructed.

SUMMARY OF INVENTION

Aspect of non-limiting embodiments of the present disclosure is to provide a loop-type heat pipe having improved a liquid introduction ability from a liquid pipe into an evaporator.

A loop-type heat pipe comprising:
an evaporator configured to vaporize an operating fluid;
a condenser configured to condense the operating fluid;
a liquid pipe configured to connect the evaporator and the condenser;
a vapor pipe configured to connect the evaporator and the condenser and to form a loop together with the liquid pipe;
a first porous body provided in the evaporator; and
a second porous body provided in the liquid pipe.

A connection region between the evaporator and the liquid pipe comprises:
a first extension part extending from the first porous body toward the second porous body, and
a space part in contact with the first extension part.

A leading end of the first extension part is inserted in a first concave part formed in the second porous body.

A loop-type heat pipe comprising:
an evaporator configured to vaporize an operating fluid;
a condenser configured to condense the operating fluid;
a liquid pipe configured to connect the evaporator and the condenser;
a vapor pipe configured to connect the evaporator and the condenser and to form a loop together with the liquid pipe;
a first porous body provided in the evaporator; and
a second porous body provided in the liquid pipe.

A connection region between the evaporator and the liquid pipe comprises:
a first extension part extending from the second porous body toward the first porous body, and
a space part in contact with the first extension part.

A leading end of the first extension part is inserted in a first concave part formed in the second porous body.

According to the present disclosure, it is possible to provide the loop-type heat pipe having improved the liquid introduction ability from the liquid pipe into the evaporator.

DESCRIPTION OF EMBODIMENTS

Figure 1:
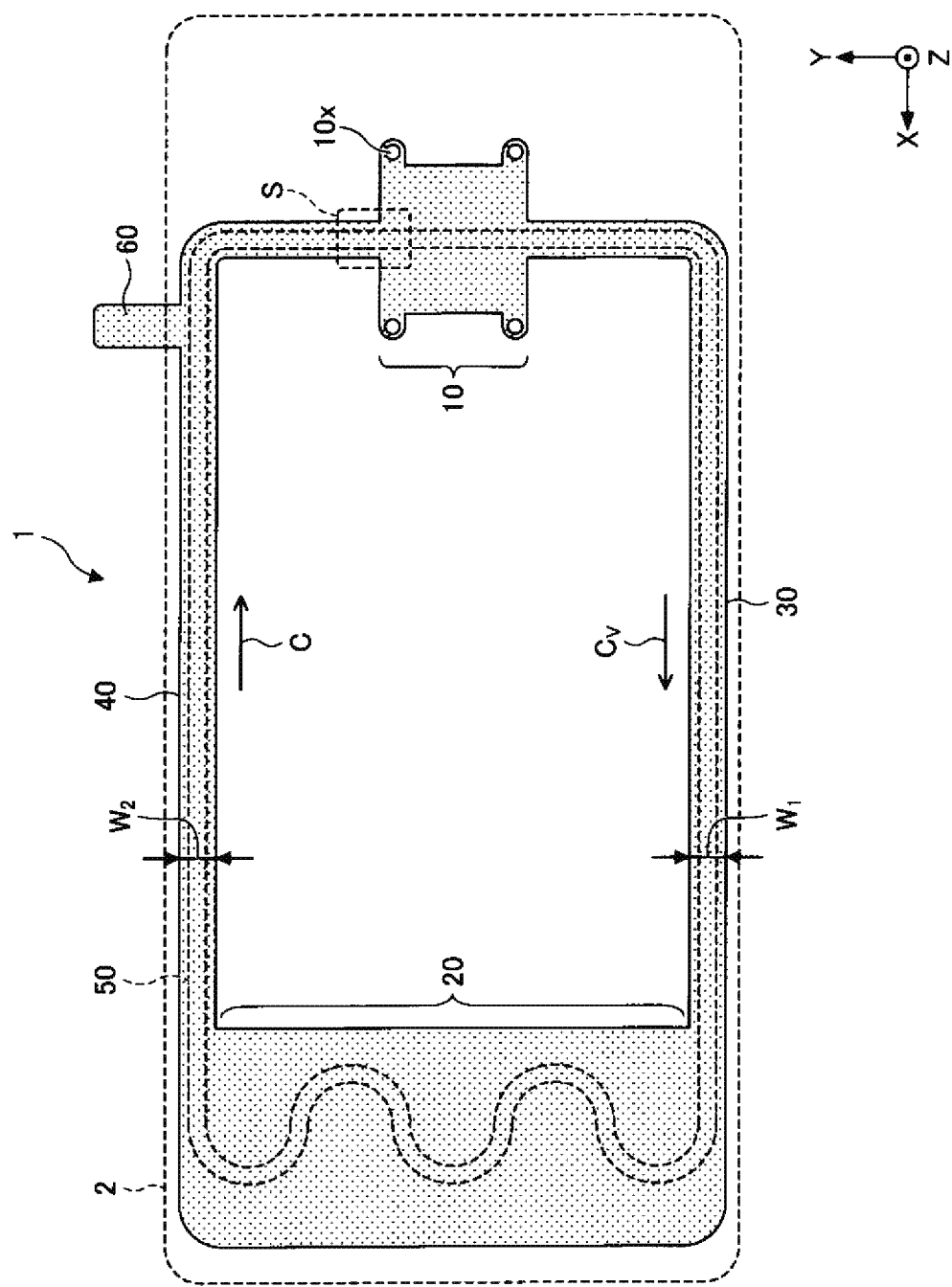
FIG. 1 is a pictorial plan view illustrating a loop-type heat pipe in accordance with an exemplary embodiment.

Hereinbelow, embodiments of the present disclosure will be described with reference to the drawings. In the meantime, in the respective drawings, the same configuration parts are denoted with the same reference numerals, and overlapping descriptions may be omitted.

Exemplary Embodiment

[Structure of Loop-Type Heat Pipe of Exemplary Embodiment]

First, a structure of a loop-type heat pipe in accordance with an exemplary embodiment is described. FIG. 1 is a pictorial plan view illustrating the loop-type heat pipe in accordance with the exemplary embodiment.

Referring to FIG. 1, a loop-type heat pipe 1 includes an evaporator 10, a condenser 20, a vapor pipe 30, a liquid pipe 40, and an inlet 60. The loop-type heat pipe 1 may be accommodated in a mobile-type electronic device 2 such as a smart phone and a tablet terminal, for example.

In the loop-type heat pipe 1, the evaporator 10 has a function of vaporizing an operating fluid C to thereby generate vapor Cv. The condenser 20 has a function of condensing the vapor Cv of the operating fluid C. The evaporator 10 and the condenser 20 are connected by the vapor pipe 30 and the liquid pipe 40, and a flow path 50, which is a loop in which the operating fluid C or the vapor Cv is to flow, is formed by the vapor pipe 30 and the liquid pipe 40.

The inlet 60 is an entry for injecting the operating fluid C into the liquid pipe 40, and is airtightly sealed after injecting the operating fluid C. In the exemplary embodiment, the inlet 60 is connected to the liquid pipe 40. However, the inlet 60 may be connected to the condenser 20 or the vapor pipe 30. In this case, the operating fluid C injected into the condenser 20 or the vapor pipe 30 flows in the flow path 50 and moves into the liquid pipe 40.

Figure 2:
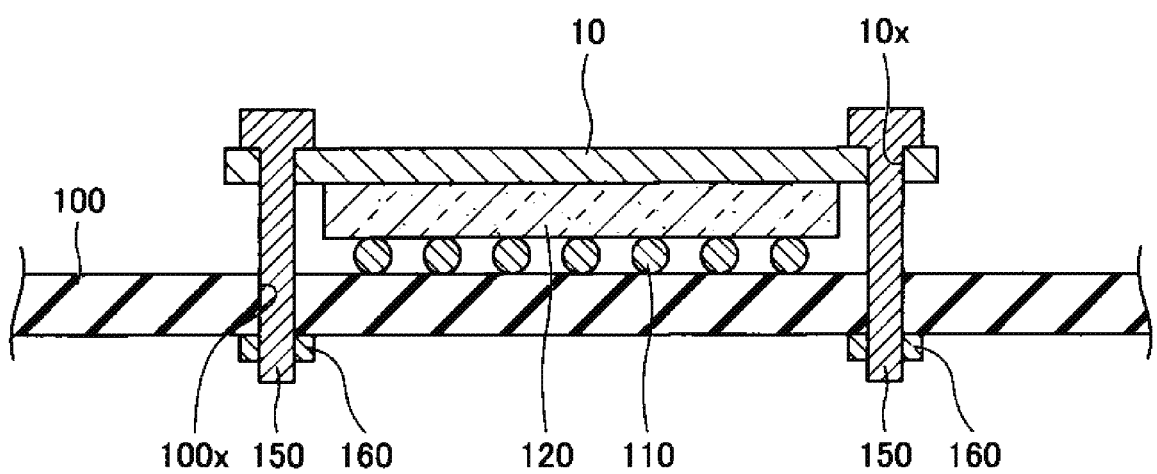
FIG. 2 is a sectional view showing an evaporator and a surrounding thereof of the loop-type heat pipe in accordance with the exemplary embodiment.

FIG. 2 is a sectional view showing the evaporator and a surrounding thereof of the loop-type heat pipe in accordance with the exemplary embodiment. As shown in FIGS. 1 and 2, the evaporator 10 is formed with four through-holes 10x, for example. Bolts 150 are inserted into the respective through-holes 10x formed in the evaporator 10 and respective through-holes 100x formed in a circuit board 100, and nuts 160 are fastened thereto from a lower surface of the circuit board 100, so that the evaporator 10 and the circuit board 100 are fixed.

On the circuit board 100, a heat generation component 120 such as a CPU is mounted via bumps 110, and an upper surface of the heat generation component 120 is closely contacted to a lower surface of the evaporator 10. The operating fluid C in the evaporator 10 is vaporized by heat generated from the heat generation component 120, so that the vapor Cv is generated.

As shown in FIG. 1, the vapor Cv generated by the evaporator 10 is guided to the condenser 20 through the vapor pipe 30, and is condensed in the condenser 20. Thereby, the heat generated from the heat generation component 120 moves to the condenser 20, so that an increase in temperature of the heat generation component 120 is suppressed. The operating fluid C condensed in the condenser 20 is guided to the evaporator 10 through the liquid pipe 40. A width $W_1$ of the vapor pipe 30 may be set to about 8 mm, for example. Also, a width $W_2$ of the liquid pipe 40 may be set to about 6 mm, for example. The width $W_1$ of the vapor pipe 30 and the width $W_2$ of the liquid pipe 40 are not limited thereto, and may be the same, for example.

The kind of the operating fluid C is not particularly limited. However, a fluid having a high vapor pressure and a high evaporative latent heat is preferably used so as to effectively cool the heat generation component 120 by the evaporative latent heat. As the fluid, for example, ammonia, water, Freon, alcohol and acetone may be exemplified.

The evaporator 10, the condenser 20, the vapor pipe 30, and the liquid pipe 40 may have a structure where a plurality of metal layers is stacked, for example, respectively. The metal layers are copper layers having high heat conductivity, for example, and are directly bonded to each other by solid-phase bonding. A thickness of each metal layer may be set to about 50 μm to 200 μm, for example.

In the meantime, the metal layer is not limited to the copper layer and may be formed of stainless steel, aluminum, magnesium alloy and the like. Also, the number of metal layers to be stacked is not particularly limited.

Figure 3A:
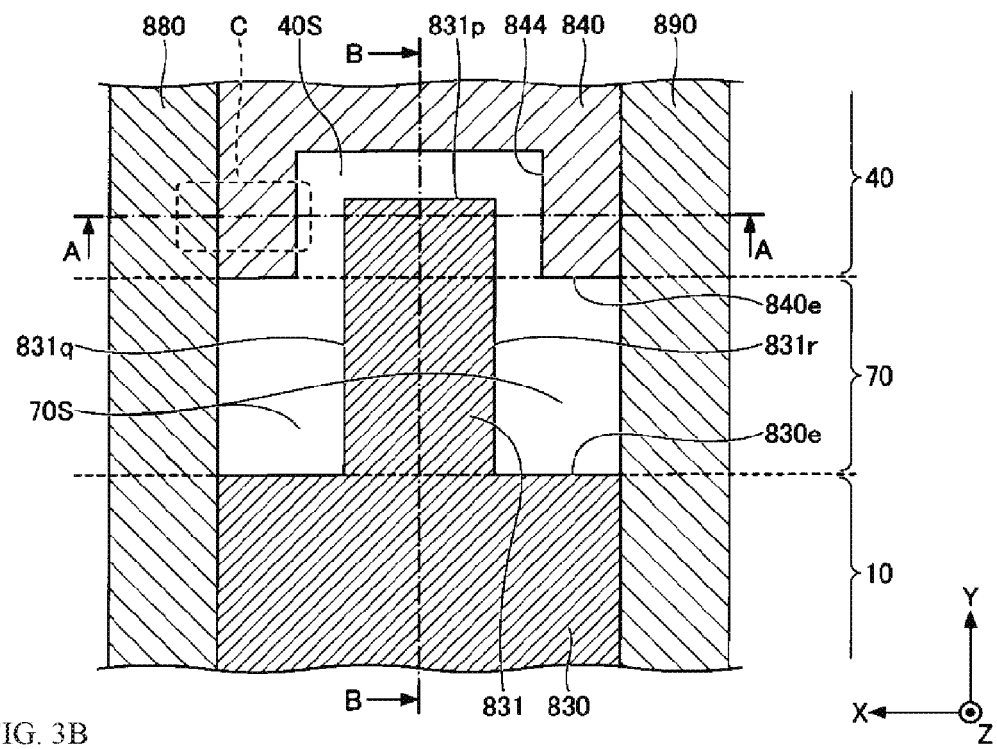
FIGS. 3A to 3C illustrate a structure of a connection region between the evaporator and a liquid pipe of the loop-type heat pipe in accordance with the exemplary embodiment.
Figure 3B:
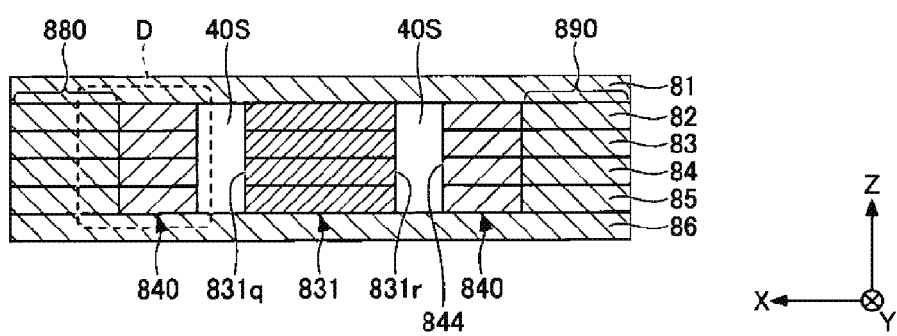
Figure 3C:
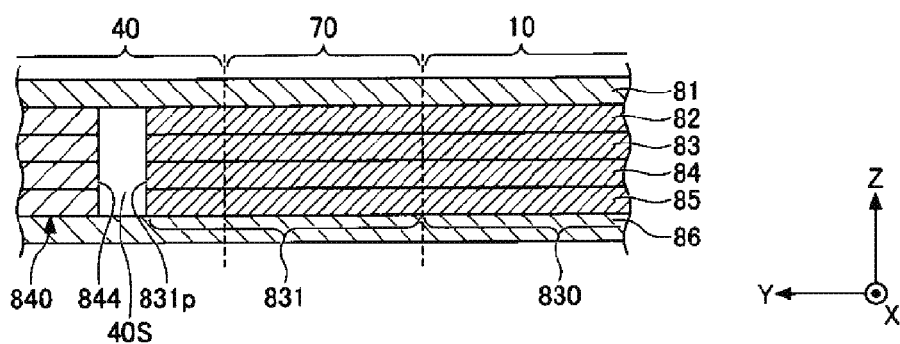

FIGS. 3A to 3C illustrate a structure of a connection region between the evaporator and the liquid pipe of the loop-type heat pipe in accordance with the exemplary embodiment. FIG. 3A is a plan view of an S part of FIG. 1, FIG. 3B is a sectional view taken along a line A-A of FIG. 3A, and FIG. 3C is a sectional view taken along a line B-B of FIG. 3A. In the meantime, in FIG. 3A, metal layers 81, 86, which are the outermost metal layers, are not shown. Also, although FIG. 3A is not a sectional view, the respective parts are hatched, in correspondence to FIGS. 3B and 3C, for convenience sake.

As shown in FIGS. 3A to 3C, the evaporator 10 and the liquid pipe 40 have a structure where six layers of metal layers 81 to 86 are stacked, respectively. In the evaporator 10 and the liquid pipe 40, the metal layers 81, 86 are outermost layers, and the metal layers 82 to 85 are inner layers. The number of metal layers to be stacked in each of the evaporator 10 and the liquid pipe 40 is not limited to six, and at least three or more metal layers have only to be stacked. That is, one or more inner layers have only to be stacked between the two outermost layers.

The metal layers 81, 86 are located at both outer sides in a thickness direction of the stacked structure of the metal layers configuring the evaporator 10 and the liquid pipe 40, and the metal layers 82 to 85 are stacked between the metal layer 81 and the metal layer 86. In the exemplary embodiment, the metal layers 81, 86 are solid layers in which a hole and a groove are not formed, and configure parts of outer walls of the evaporator 10 and the liquid pipe 40.

The metal layers 81 to 86 are copper layers having high heat conductivity, for example, and are directly bonded to each other by solid-phase bonding. A thickness of each of the metal layers 81 to 86 may be set to about 50 μm to 200 μm, for example. In the meantime, the metal layers 81 to 86 are not limited to the copper layers and may be formed of stainless steel, aluminum, magnesium alloy and the like.

The evaporator 10 is provided therein with a porous body 830, and the liquid pipe 40 is provided therein with a porous body 840. More specifically, in the inner layers (the metal layers 82 to 85) of the evaporator 10, the porous body 830 is provided between a pipe wall 880 and a pipe wall 890 arranged to face each other with being spaced. The pipe walls 880, 890 and the porous body 830 are integrally (continuously) provided. In FIGS. 3A to 3C, for convenience sake, a boundary between the pipe wall and the porous body is shown with the solid line, and they are differently hatched. Also, in the inner layers (the metal layers 82 to 85) of the liquid pipe 40, the porous body 840 is provided between the pipe wall 880 and the pipe wall 890 arranged to face each other with being spaced. The pipe walls 880, 890 and the porous body 840 are integrally (continuously) provided. In FIGS. 3A to 3C, for convenience sake, a boundary between the pipe wall and the porous body is shown with the solid line, and they are differently hatched.

Figure 4A:
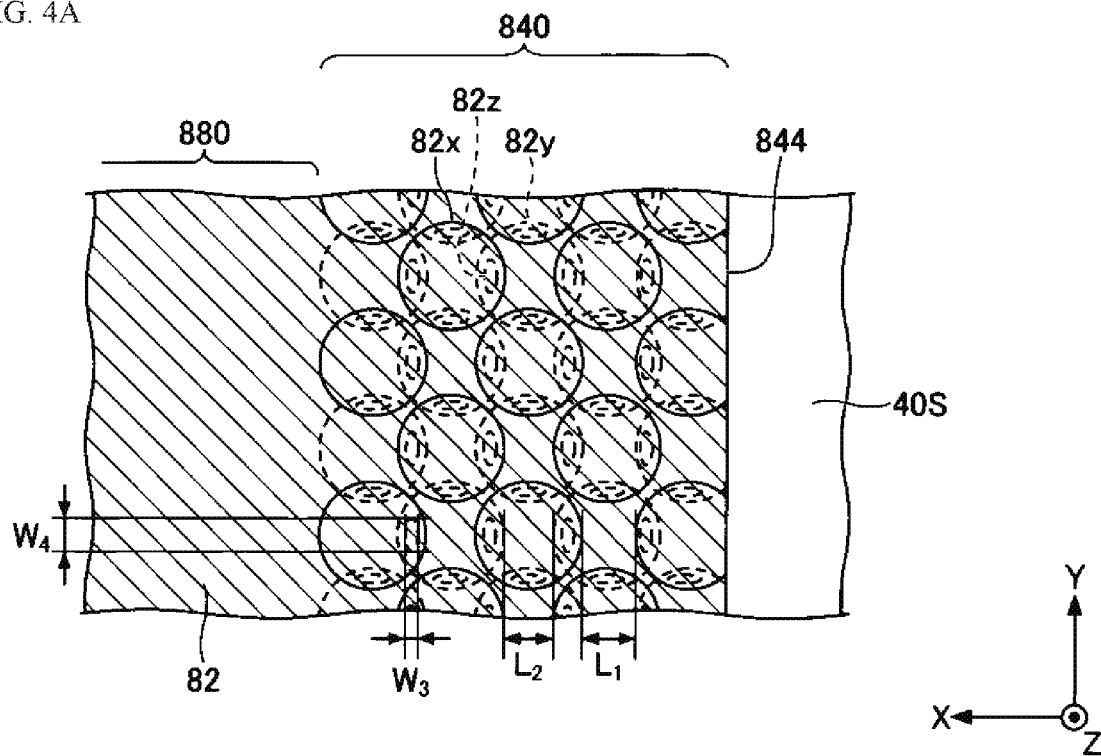
FIGS. 4A and 4B illustrate a porous body.
Figure 4B:
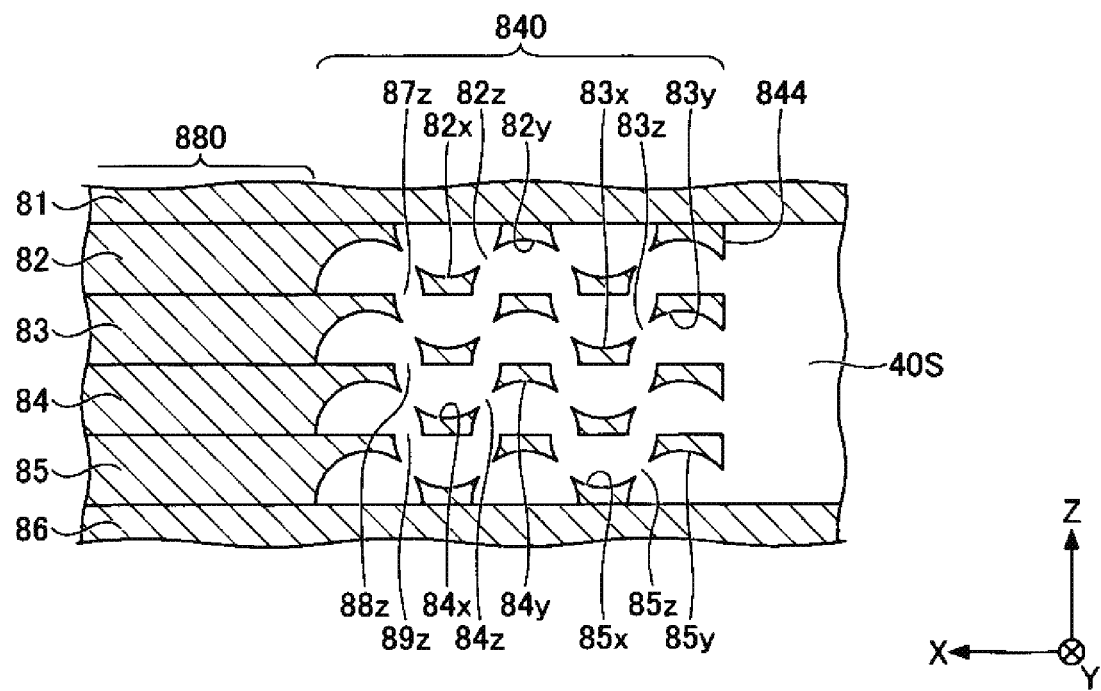

FIGS. 4A and 4B illustrate the porous body, in which FIG. 4A is an enlarged view of a C part of FIG. 3A, and FIG. 4B is an enlarged view of a D part of FIG. 3B. In the meantime, in FIGS. 4A and 4B, the porous body 840 is shown. However, the porous body 830 has the same structure as the porous body 840.

As shown in FIGS. 4A and 4B, in the porous body 840, the metal layer 81 of the first layer (one outermost layer) and the metal layer 86 of the sixth layer (the other outermost layer) are not formed with a hole and a groove (i.e., the metal layers of the outermost layers are solid layers). In contrast, the metal layer 82 is formed with a plurality of bottomed holes 82x hollowed from an upper surface to a substantially central part in a thickness direction and a plurality of bottomed holes 82y hollowed from a lower surface to a substantially central part in the thickness direction.

The bottomed holes 82x and the bottomed holes 82y are alternately arranged in the X direction, as seen from above. Also, the bottomed holes 82x and the bottomed holes 82y are alternately arranged in the Y direction, as seen from above. The bottomed holes 82x and the bottomed holes 82y alternately arranged in the X direction are partially overlapped, as seen from above, and the overlapping portions communicate with each other, thereby forming fine pores 82z, such as interstices or channels between adjacent bottomed holes 82x and 82y to form interconnected cavities. The bottomed holes 82x and the bottomed holes 82y alternately arranged in the Y direction are partially overlapped, as seen from above, and the overlapping portions communicate with each other, thereby forming fine pores 82z.

The bottomed holes 82x, 82y may be formed into a circular shape having a diameter of about 100 μm to 300 μm, for example, as seen from above. However, the bottomed holes may be formed to have any shape such as an elliptical shape, a polygonal shape and the like. A depth of each of the bottomed holes 82x, 82y may be set to about a half of a thickness of the metal layer 82, for example. An interval $L_1$ between the bottomed holes 82x adjacent to each other in the X direction may be set to about 100 μm to 400 μm, for example. An interval between the bottomed holes 82x adjacent to each other in the Y direction may be set in the same manner. An interval $L_2$ between the bottomed holes 82y adjacent to each other in the X direction may be set to about 100 μm to 400 μm, for example. An interval between the bottomed holes 82y adjacent to each other in the Y direction may be set in the same manner.

A sectional shape of each of the bottomed holes 82x, 82y in parallel with the XZ plane and a sectional shape thereof in parallel with the YZ plane may be substantially semicircular or semi-elliptical. However, the sectional shape of each of the bottomed holes 82x, 82y in parallel with the XZ plane and a sectional shape thereof in parallel with the YZ plane may be a tapered shape of which a width increases from a bottom surface toward an opening, or may be a shape perpendicular to the bottom surface.

A width $W_3$ of the fine pore 82z in a width direction may be set to about 10 μm to 50 μm, for example. Also, a width $W_4$ of the fine pore 82z in a longitudinal direction may be set to about 50 μm to 150 μm, for example.

The metal layer 83 is formed with a plurality of bottomed holes 83x hollowed from an upper surface to a substantially central part in a thickness direction and a plurality of bottomed holes 83y hollowed from a lower surface to a substantially central part in the thickness direction.

The bottomed holes 83x and the bottomed holes 83y are alternately arranged in the X direction, as seen from above. Also, the bottomed holes 83x and the bottomed holes 83y are alternately arranged in the Y direction, as seen from above. The bottomed holes 83x and the bottomed holes 83y alternately arranged in the X direction are partially overlapped, as seen from above, and the overlapping portions communicate with each other, thereby forming fine pores 83z, such as interstices or channels between adjacent bottomed holes 83x and 83y to form interconnected cavities. The bottomed holes 83x and the bottomed holes 83y alternately arranged in the Y direction are partially overlapped, as seen from above, and the overlapping portions communicate with each other, thereby forming fine pores 83z. The shapes and the like of the bottomed holes 83x, 83y and the fine pore 83z may be the same as the shapes and the like of the bottomed holes 82x, 82y and the fine pore 82z, for example.

Also, the bottomed holes 82y of the metal layer 82 and the bottomed holes 83x of the metal layer 83 are partially overlapped, as seen from above, and the overlapping portions communicate with each other, thereby forming fine pores 87z, such as interstices or channels between adjacent bottomed holes 82y and 83x to form interconnected cavities.

The metal layer 84 is formed with a plurality of bottomed holes 84x hollowed from an upper surface to a substantially central part in a thickness direction and a plurality of bottomed holes 84y hollowed from a lower surface to a substantially central part in the thickness direction.

The bottomed holes 84x and the bottomed holes 84y are alternately arranged in the X direction, as seen from above. Also, the bottomed holes 84x and the bottomed holes 84y are alternately arranged in the Y direction, as seen from above. The bottomed holes 84x and the bottomed holes 84y alternately arranged in the X direction are partially overlapped, as seen from above, and the overlapping portions communicate with each other, thereby forming fine pores 84z, such as interstices or channels between adjacent bottomed holes 84x and 84y to form interconnected cavities. The bottomed holes 84x and the bottomed holes 84y alternately arranged in the Y direction are partially overlapped, as seen from above, and the overlapping portions communicate with each other, thereby forming fine pores 84z. The shapes and the like of the bottomed holes 84x, 84y and the fine pore 84z may be the same as the shapes and the like of the bottomed holes 82x, 82y and the fine pore 82z, for example.

Also, the bottomed holes 83y of the metal layer 83 and the bottomed holes 84x of the metal layer 84 are partially overlapped, as seen from above, and the overlapping portions communicate with each other, thereby forming fine pores 88z, such as interstices or channels between adjacent bottomed holes 83y and 84x to form interconnected cavities.

The metal layer 85 is formed with a plurality of bottomed holes 85x hollowed from an upper surface to a substantially central part in a thickness direction and a plurality of bottomed holes 85y hollowed from a lower surface to a substantially central part in the thickness direction.

The bottomed holes 85x and the bottomed holes 85y are alternately arranged in the X direction, as seen from above. Also, the bottomed holes 85x and the bottomed holes 85y are alternately arranged in the Y direction, as seen from above. The bottomed holes 85x and the bottomed holes 85y alternately arranged in the X direction are partially overlapped, as seen from above, and the overlapping portions communicate with each other, thereby forming fine pores 85z, such as interstices or channels between adjacent bottomed holes 85x and 85y to form interconnected cavities. The bottomed holes 85x and the bottomed holes 85y alternately arranged in the Y direction are partially overlapped, as seen from above, and the overlapping portions communicate with each other, thereby forming fine pores 85z. The shapes and the like of the bottomed holes 85x, 85y and the fine pore 85z may be the same as the shapes and the like of the bottomed holes 82x, 82y and the fine pore 82z, for example.

Also, the bottomed holes 84y of the metal layer 84 and the bottomed holes 85x of the metal layer 85 are partially overlapped, as seen from above, and the overlapping portions communicate with each other, thereby forming fine pores 89z, such as interstices or channels between adjacent bottomed holes 84y and 85x to form interconnected cavities.

The fine pores formed in the respective metal layers are formed to communicate with each other, and the fine pores communicating with each other are three-dimensionally distributed in the porous body 840. For this reason, the operating fluid C is three-dimensionally spread in the fine pores communicating with each other by the capillary force.

In FIGS. 4A and 4B, the bottomed hole 82x, the bottomed hole 83x, the bottomed hole 84x and the bottomed hole 85x, and the bottomed hole 82y, the bottomed hole 83y, the bottomed hole 84y and the bottomed hole 85y are overlapped, as seen from above. However, the present disclosure is not limited thereto. That is, the bottomed hole 82x, the bottomed hole 83x, the bottomed hole 84x and the bottomed hole 85x may not be necessarily overlapped, as seen from above, inasmuch as the fine pores communicating with each other are three-dimensionally distributed in the porous body 840. Also, the bottomed hole 82y, the bottomed hole 83y, the bottomed hole 84y and the bottomed hole 85y may not be necessarily overlapped, as seen from above.

Figure 5A:
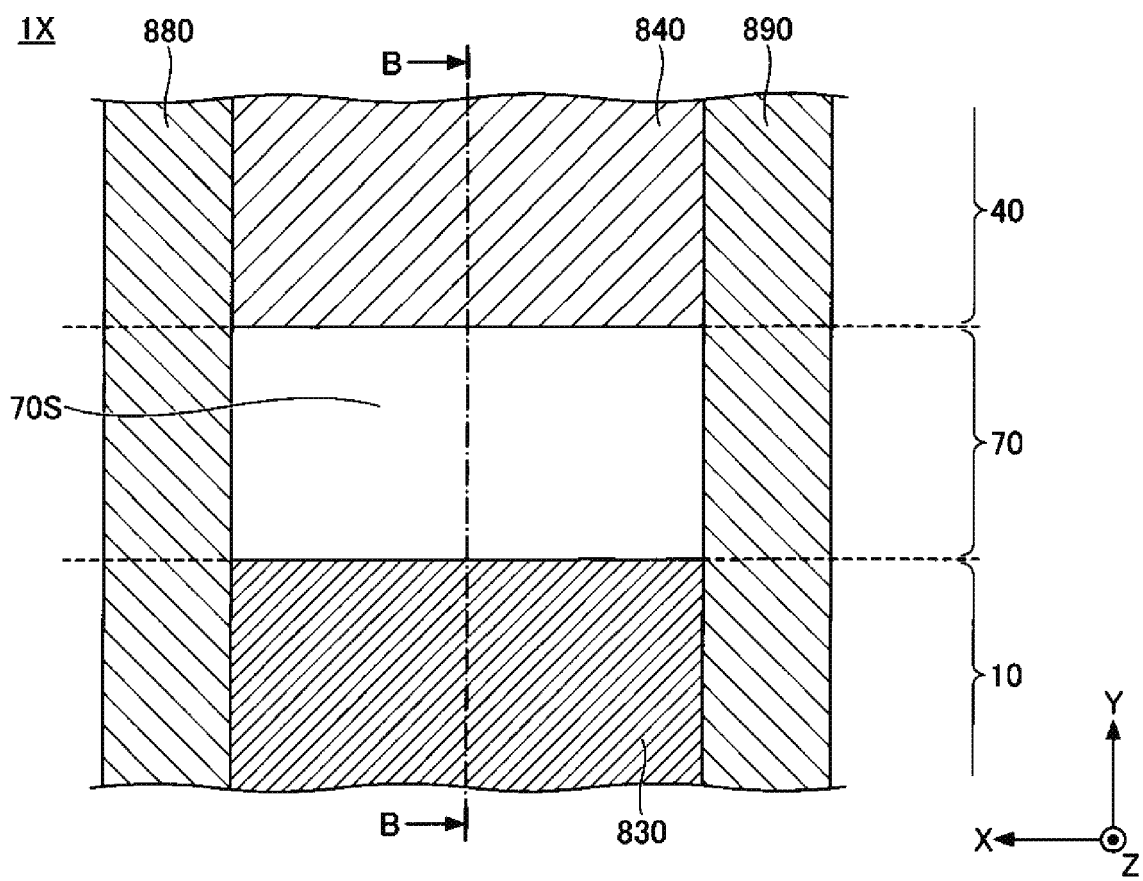
FIGS. 5A and 5B illustrate a loop-type heat pipe of the related art.
Figure 5B:
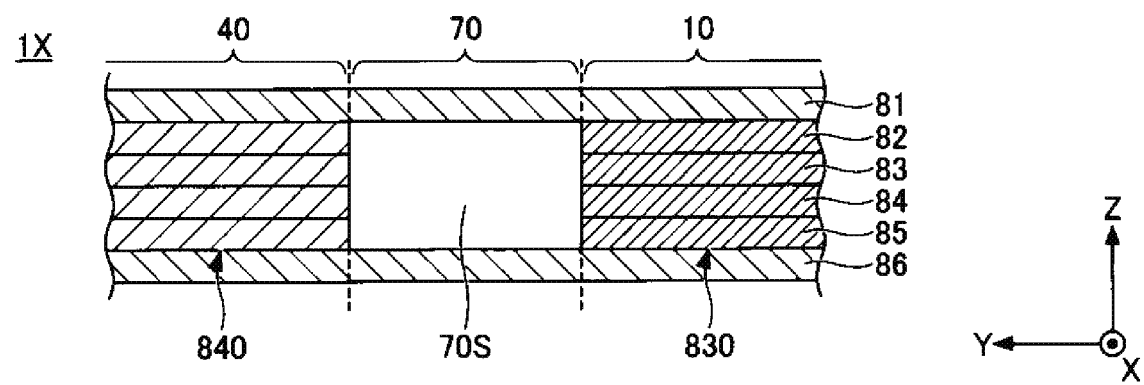

FIGS. 5A and 5B illustrate a loop-type heat pipe of the related art, in which FIG. 5A is a plan view corresponding to FIG. 3A, and FIG. 5B is a sectional view taken along a line B-B of FIG. 5A and corresponds to FIG. 3C.

As shown in FIGS. 5A and 5B, in a loop-type heat pipe IX of the related art, in the inner layers (the metal layers 82 to 85) of the evaporator 10, the porous body 830 is provided between the pipe wall 880 and the pipe wall 890 arranged to face each other with being spaced. Also, in the inner layers (the metal layers 82 to 85) of the liquid pipe 40, the porous body 840 is provided between the pipe wall 880 and the pipe wall 890 arranged to face each other with being spaced, like the evaporator 10. Also, although the connection region 70 is provided between the evaporator 10 and the liquid pipe 40, the porous bodies 830, 840 are not arranged in the connection region 70. That is, in the loop-type heat pipe IX of the related art, only a space part 70S is present in the connection region 70 between the pipe wall 880 and the pipe wall 890 facing each other.

In contrast, as shown in FIGS. 3A to 3C, in the loop-type heat pipe 1, the evaporator 10 is provided therein with the porous body 830, and the liquid pipe 40 is provided therein with the porous body 840 and a space part 40S. Also, the connection region 70 between the evaporator 10 and the liquid pipe 40 is provided with a porous extension part 831 (which is hereinafter referred as extension part) and a space part 70S. The space part 70S is in contact with parts of side surfaces 831q, 831r of the extension part 831, a part of an end portion of the porous body 830, and a part of an end portion of the porous body 840.

The porous extension part 831 protrudes in the Y direction (toward the liquid pipe 40) from a central part of an end face 830e (which faces the connection region 70) of the porous body 830 in the X direction, as seen from above.

The porous extension part 831 is provided integrally (continuously) with the porous body 830 in the evaporator 10. Also, the porous extension part 831 and the porous body 830 are made of the same material. The porous extension part 831 and the porous body 830 in the evaporator 10 form a convex shape, for example, as seen from above.

An end portion, which faces toward the evaporator 10, of the porous body 840 provided in the liquid pipe 40 has a concave part 844. More specifically, the concave part 844 is hollowed in the Y direction (toward the liquid pipe 40) from a central part of an end face 840e (which faces the connection region 70) of the porous body 840 in the X direction, as seen from above.

The porous bodies 830, 840 includes the four stacked metal layers (metal layers 82 to 85), and the extension part 831 includes the four stacked metal layers (metal layers 82 to 85), like the porous bodies 830, 840. That is, the extension part 831 is formed by portions extending from the porous bodies 830, 840 of the four metal layers (metal layers 82 to 85). The extension part 831 has a porous structure, like the porous bodies 830, 840.

Also, the concave part 844 includes the four stacked metal layers (metal layers 82 to 85), like the porous bodies 830, 840. That is, the concave part 844 is formed as the four metal layers (metal layers 82 to 85) are hollowed, and has a porous structure, like the porous bodies 830, 840.

A leading end (which faces the liquid pipe 40) of the extension part 831 in the Y direction reaches an inside of the liquid pipe 40 beyond the connection region 70, and is inserted in the concave part 844 formed in the porous body 840, as seen from above.

A leading end face 831p and side surfaces 831q, 831r of the extension part 831 are not in contact with an inner wall surface of the concave part 844. That is, the leading end face 831p and side surfaces 831q, 831r of the extension part 831 are arranged to face the inner wall surface of the concave part 844 with being spaced therefrom. The space part 40S is formed between the leading end face 831p and side surfaces 831q, 831r of the extension part 831 and the inner wall surface of the concave part 844. The space part 40S is formed to communicate with the space part 70S. In the meantime, as shown in FIGS. 3B and 3C, an upper surface of the extension part 831 is in contact with a lower surface of the metal layer 81, and a lower surface of the extension part 831 is in contact with an upper surface of the metal layer 86.

[Manufacturing Method of Loop-Type Heat Pipe of Exemplary Embodiment]

Subsequently, a manufacturing method of the loop-type heat pipe in accordance with the exemplary embodiment is described, focusing on a manufacturing process of the porous body. FIGS. 6A to 7B exemplify a manufacturing process of the loop-type heat pipe in accordance with the exemplary embodiment, and shows sectional views corresponding to FIG. 4B. In the meantime, FIGS. 6A to 7B depict formation of the porous body 840. However, the porous body 830 is also formed by the same manner.

Figure 6A:
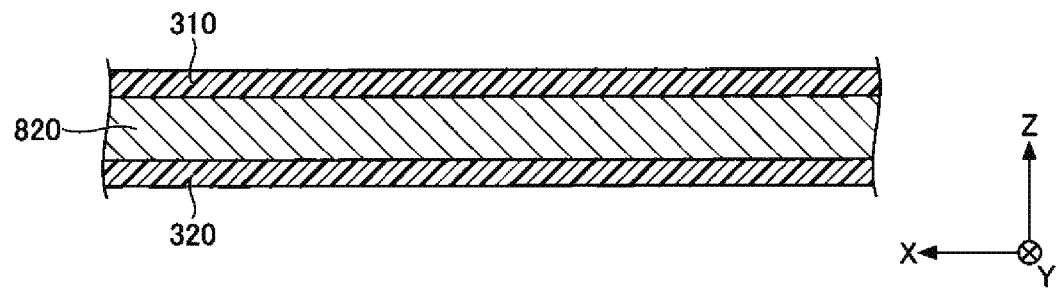
FIGS. 6A to 6D illustrate a manufacturing process of the loop-type heat pipe in accordance with the exemplary embodiment (1 thereof).

First, in a process shown in FIG. 6A, a metal sheet 820 formed into a planar shape of FIG. 1 is prepared. Then, a resist layer 310 is formed on an upper surface of the metal sheet 820, and a resist layer 320 is formed on a lower surface of the metal sheet 820. The metal sheet 820 is a member that is finally to be the metal layer 82, and may be formed of, for example, copper, stainless steel, aluminum, magnesium alloy or the like. A thickness of the metal sheet 820 may be set to about 50 μm to 200 μm, for example. As the resist layers 310, 320, a photosensitive dry film resist or the like may be used, for example.

Figure 6B:
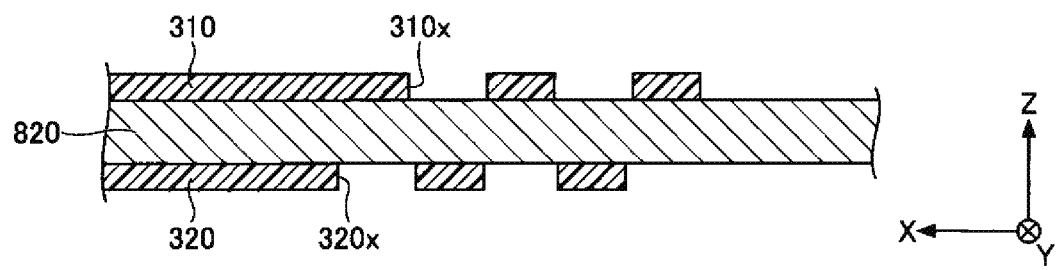

Subsequently, in a process shown in FIG. 6B, the resist layer 310 is exposed and developed to form openings 310x for selectively exposing the upper surface of the metal sheet 820, in a region in which the porous body 840 of the metal sheet 820 is to be formed. Also, the resist layer 320 is exposed and developed to form openings 320x for selectively exposing the lower surface of the metal sheet 820. The openings 310x are formed and arranged so as to correspond to the shape and arrangement of the bottomed holes 82x shown in FIGS. 4A and 4B. Also, the openings 320x are formed and arranged so as to correspond to the shape and arrangement of the bottomed holes 82y shown in FIGS. 4A and 4B.

Figure 6C:
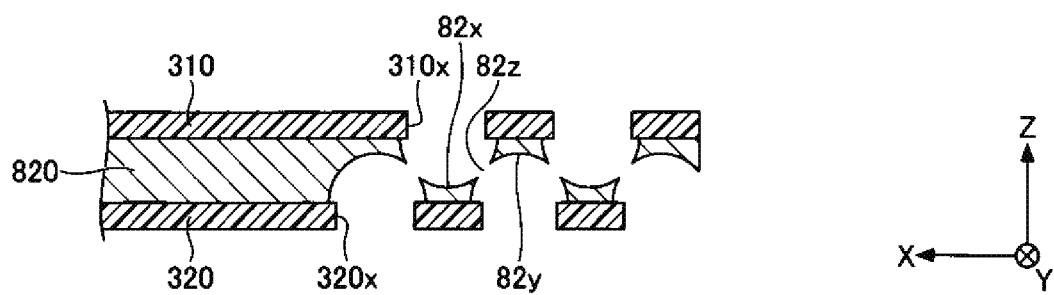

Subsequently, in a process shown in FIG. 6C, the metal sheet 820 exposed into the openings 310x is half-etched from the upper surface of the metal sheet 820, and the metal sheet 820 exposed into the openings 320x is half-etched from the lower surface of the metal sheet 820. Thereby, the bottomed holes 82x are formed in the upper surface of the metal sheet 820, the bottomed holes 82y are formed in the lower surface. Also, since the openings 310x and the openings 320x alternately arranged in the X direction in the front and back surfaces are partially overlapped, as seen from above, the overlapping portions communicate with each other, thereby forming the fine pores 82z. Also, a region in which any of the resist layers 310, 320 is not formed, as seen from above, is half-etched from both surfaces and is penetrated. The region will be finally the space part. When half etching the metal sheet 820, a ferric chloride solution may be used, for example.

Figure 6D:
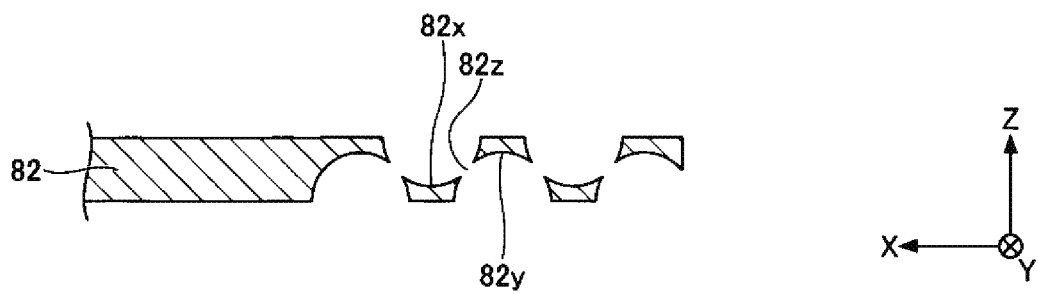

Subsequently, in a process shown in FIG. 6D, the resist layers 310, 320 are removed by a removing solution. Thereby, the metal layer 82 is completed.

Figure 7A:
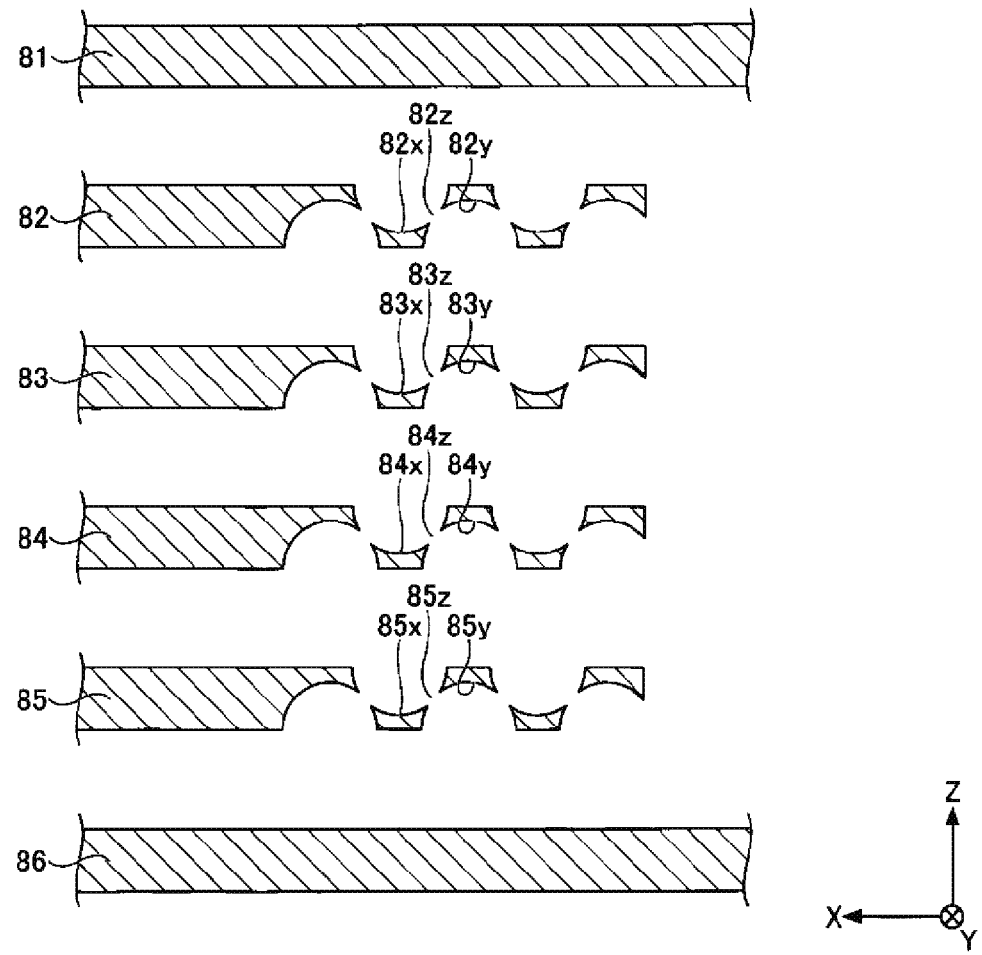
FIGS. 7A and 7B illustrate the manufacturing process of the loop-type heat pipe in accordance with the exemplary embodiment (2 thereof).

Subsequently, in a process shown in FIG. 7A, solid metal layers 81, 86 having no holes and grooves are prepared. Also, the metal layers 83 to 85 are formed by the same method as the metal layer 82. The positions of the bottomed holes and the fine pores formed in the metal layers 83 to 85 are as shown in FIGS. 4A and 4B, for example.

Figure 7B:
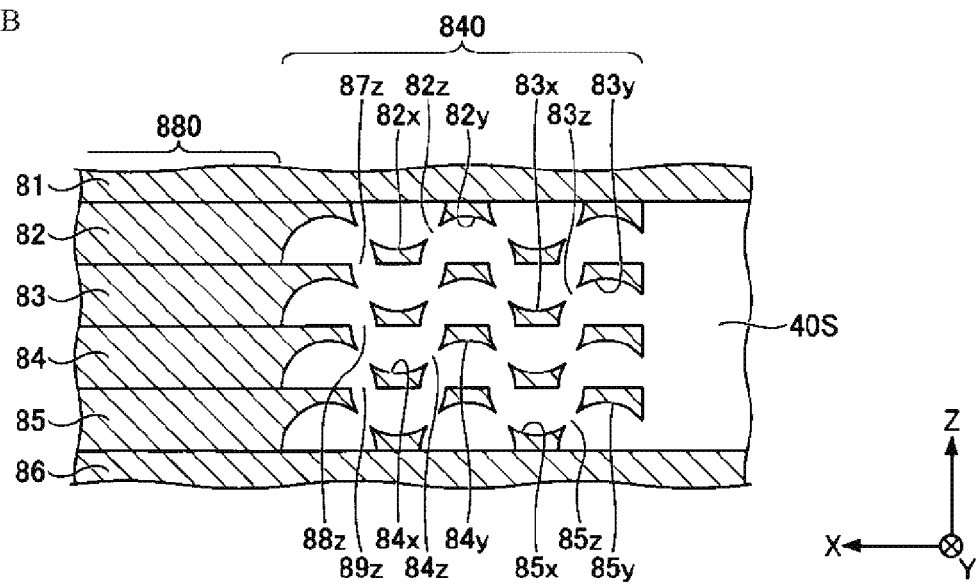

Subsequently, in a process shown in FIG. 7B, the respective metal layers are stacked in order shown in FIG. 7A, and are then pressurized and heated for solid-phase bonding. Thereby, the metal layers adjacent to each other are directly bonded, so that the loop-type heat pipe 1 including the evaporator 10, the condenser 20, the vapor pipe 30 and the liquid pipe 40 is completed, the evaporator 10 is formed therein with the porous body 830 and the liquid pipe 40 is formed therein with the porous body 840. Thereafter, the liquid pipe 40 is exhausted by using a vacuum pump and the like, and the operating fluid C is injected from the inlet 60 into the liquid pipe 40. Thereafter, the inlet 60 is sealed.

Here, the solid-phase bonding is a method of heating and softening targets to be bonded in a solid-phase (solid) state without melting the same, and further pressurizing, plastically deforming and bonding the same. In the meantime, all materials of the metal layers 81 to 86 are preferably the same so that the metal layers adjacent to each other can be favorably bonded by the solid-phase bonding.

In this way, the evaporator 10 is provided therein with the porous body 830, and the porous body 830 extends to the connection region 70. Also, the liquid pipe 40 is provided therein with the porous body 840, and the porous body 840 extends to the connection region 70. Also, the connection region 70 has the extension part 831 extending from the porous body 830 and the space part 70S in contact with the extension part 831, and the extension part 831 has the same porous structure as the porous bodies 830, 840. The leading end of the extension part 831 is inserted in the concave part 844 formed in the porous body 840.

The porous body 840 has great effects on movement and storage of the operating fluid C by the capillary force. However, if the operating fluid C does not move up to a limit storage amount, for example, the operating fluid C cannot leak outside the porous body 840. Therefore, like the loop-type heat pipe of the related art, when the connection region between the liquid pipe and the evaporator has only the space part and there is no extension part from the porous body, a trouble may occur in introduction of liquid from the liquid pipe into the evaporator.

On the other hand, in the loop-type heat pipe 1, the connection region 70 is provided with the extension part 831, and the leading end of the extension part 831 is inserted in the concave part 844 formed in the porous body 840. For this reason, it is possible to effectively guide the liquid-phase operating fluid C in the liquid pipe 40 to the evaporator 10 by the capillary force generated in the porous body configuring the extension part 831, so that it is possible to improve a liquid introduction ability from the liquid pipe 40 into the evaporator 10.

Also, if the connection region between the liquid pipe and the evaporator is provided only with the extension part and the space part is not provided, heat may be leaked from the evaporator 10, so that a heat transport characteristic may be deteriorated. In the loop-type heat pipe 1, since the connection region 70 is provided with the space part 70S, in addition to the extension part 831, it is possible to suppress the heat leak from the evaporator 10. Also, since the space part 70S can be used as a region for retaining the operating fluid C, it is possible to prevent dry out (depletion of the operating fluid C).

First Modified Embodiment of Exemplary Embodiment

In a first modified example of the exemplary embodiment, an example in which the extension part is formed from only some metal layers configuring the porous body is described. In the meantime, in the first modified example of the exemplary embodiment, the descriptions of the same configurations as the exemplary embodiment may be omitted.

Figure 8A:
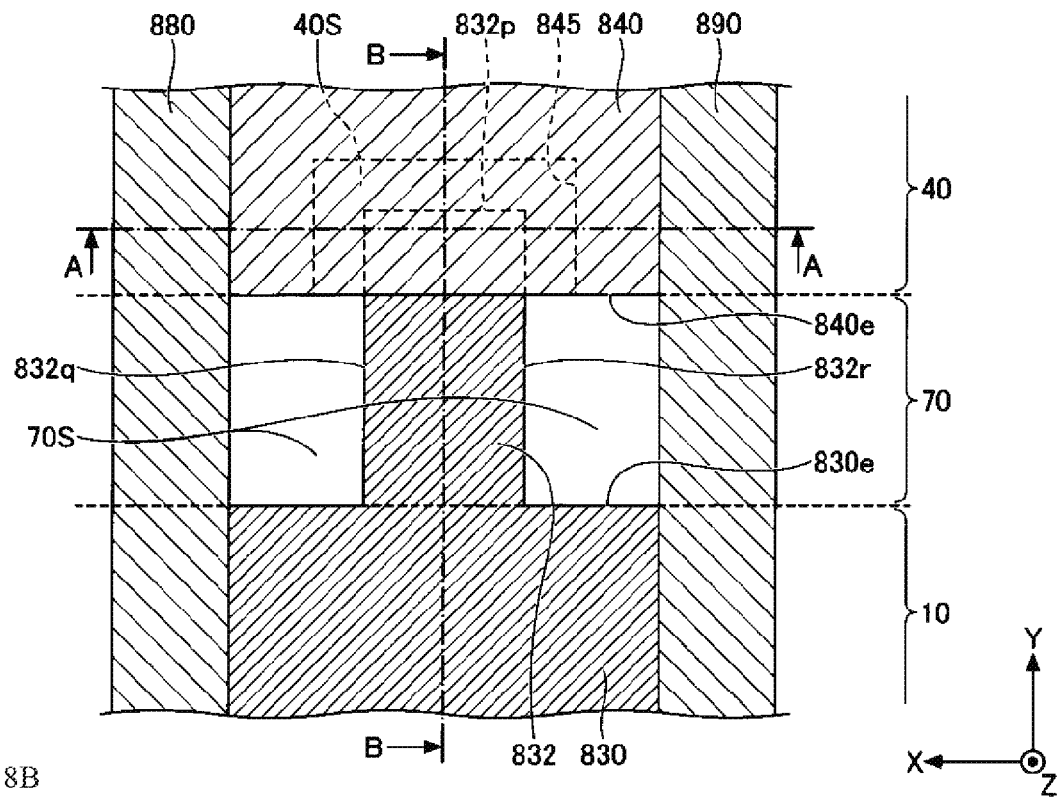
FIGS. 8A to 8C illustrate a structure of a connection region between an evaporator and a liquid pipe of a loop-type heat pipe in accordance with a first modified example of the exemplary embodiment (1 thereof).
Figure 8B:
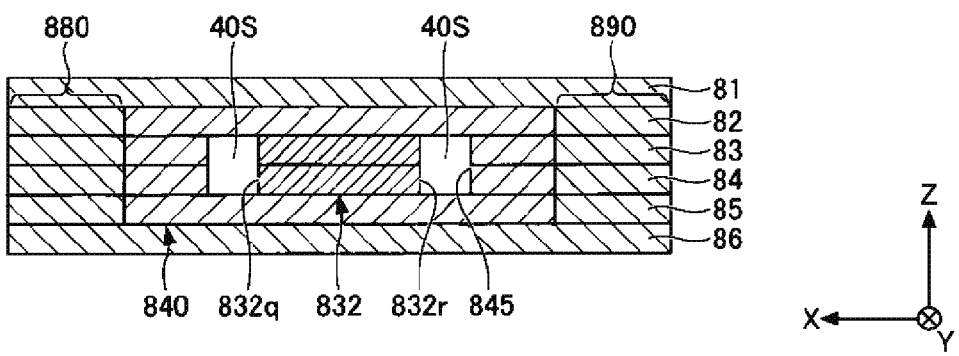
Figure 8C:
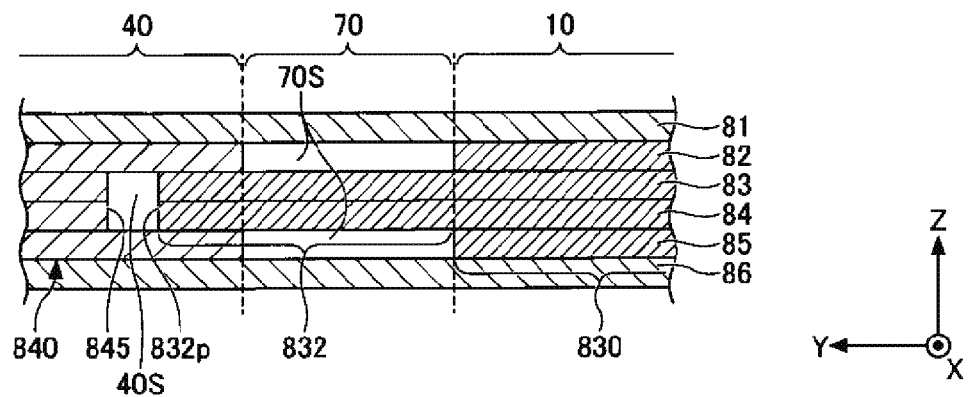

FIG. 8A illustrates a structure of a connection region between an evaporator and a liquid pipe of a loop-type heat pipe in accordance with the first modified example of the exemplary embodiment, and is a plan view corresponding to FIG. 3A. Also, FIG. 8B is a sectional view taken along a line A-A of FIG. 8A, and FIG. 8C is a sectional view taken along a line B-B of FIG. 8A. In the meantime, in FIG. 8A, the metal layers 81, 86, which are the outermost metal layers, are not shown. Also, although FIG. 8A is not a sectional view, the respective parts are hatched, in correspondence to FIGS. 8B and 8C, for convenience sake.

As shown in FIGS. 8A to 8C, in the first modified example of the exemplary embodiment, the connection region 70 has an extension part 832 extending from the porous body 830, and the space part 70S in contact with the extension part 832. The extension part 832 has a planar shape that is similar to the extension part 831 shown in FIGS. 3A to 3C. However, while the extension part 831 is formed by the metal layers 82 to 85, the extension part 832 is formed only by the metal layers 83, 84.

Also, only the metal layers 83, 84 of the porous body 840 are provided with a concave part 845, and a leading end (which faces a liquid pipe 40) of the extension part 832 in the Y direction reaches the inside of the liquid pipe 40 beyond the connection region 70, and is inserted in the concave part 845 formed in the porous body 840, as seen from above.

A leading end face 832p and side surfaces 832q, 832r of the extension part 832 are not in contact with an inner wall surface of the concave part 845. That is, the leading end face 832p and the side surfaces 832q, 832r of the extension part 832 are arranged to face the inner wall surface of the concave part 845 with being spaced therefrom. The space part 40S is formed between the leading end face 832p and the side surfaces 832q, 832r of the extension part 832 and the inner wall surface of the concave part 845. The space part 40S is formed to communicate with the space part 70S. In the meantime, as shown in FIGS. 8B and 8C, an upper surface of the part, which is inserted in the concave part 845, of the extension part 832 is in contact with the lower surface of the metal layer 82, and a lower surface of the part inserted in the concave part 845 is in contact with the upper surface of the metal layer 85.

Figure 9A:
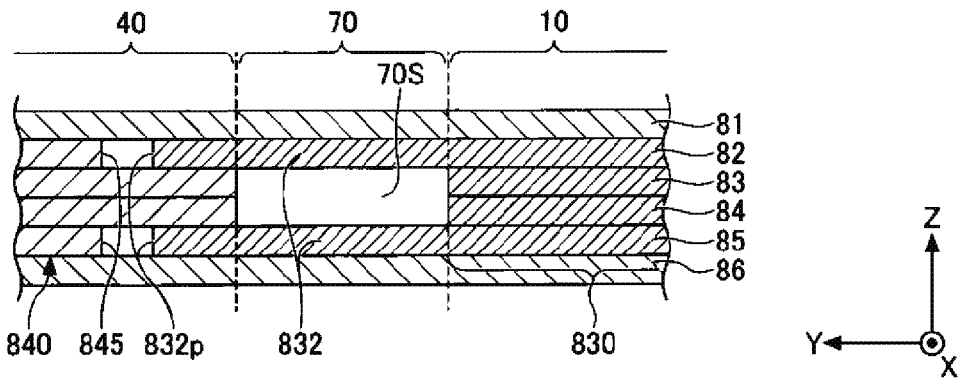
FIGS. 9A to 9D illustrate the structure of the connection region between the evaporator and the liquid pipe of the loop-type heat pipe in accordance with the first modified example of the exemplary embodiment (2 thereof).
Figure 9B:
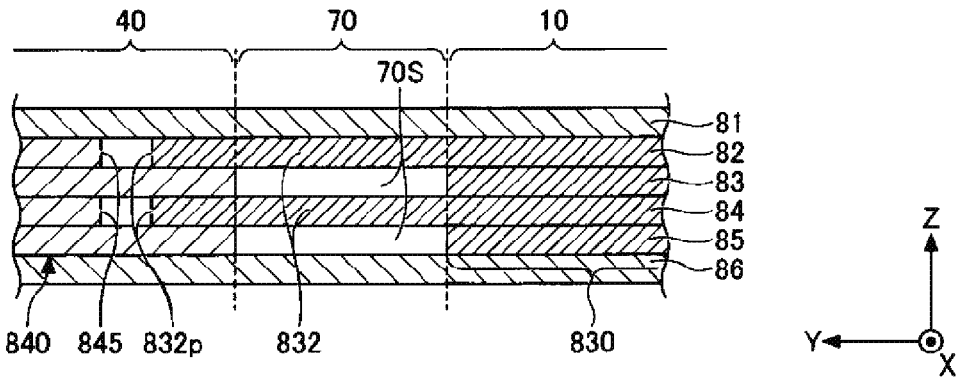
Figure 9C:
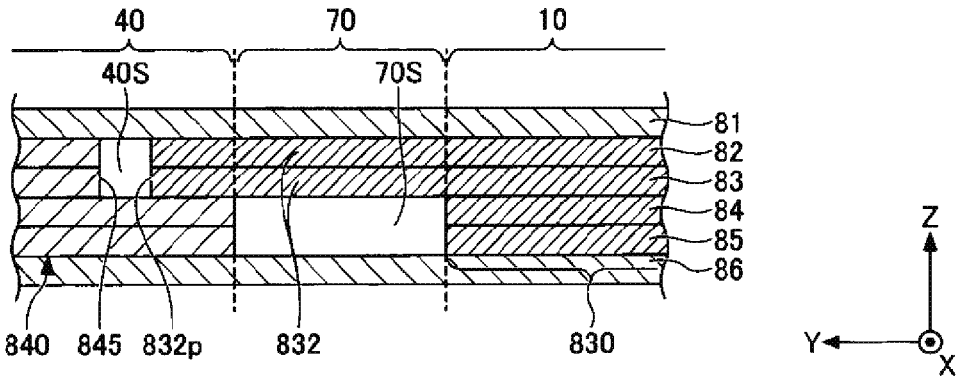
Figure 9D:
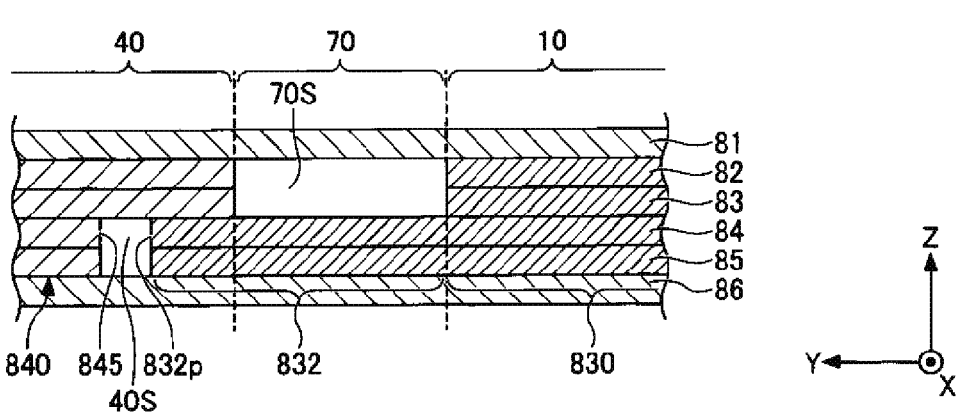

In the meantime, as shown in FIG. 9A, the extension part 832 may be formed of only the metal layers 82, 85, and the concave part 845 may be formed in only the metal layers 82, 85. Also, as shown in FIG. 9B, the extension part 832 may be formed of only the metal layers 82, 84, and the concave part 845 may be formed in only the metal layers 82, 84. Also, as shown in FIG. 9C, the extension part 832 may be formed of only the metal layers 82, 83, and the concave part 845 may be formed in only the metal layers 82, 83. Also, as shown in FIG. 9D, the extension part 832 may be formed of only the metal layers 84, 85, and the concave part 845 may be formed in only the metal layers 84, 85. Alternatively, the extension part 832 may be formed of one or three layers of the metal layers 82 to 85, and the concave part 845 may be formed in only the metal layer forming the extension part 832.

In this way, the extension part 832 may be formed from only some metal layers, not all the metal layers 82 to 85 configuring the porous body 830. As some metal layers forming the extension part 832, one to three layers may be arbitrarily selected from the metal layers 82 to 85. That is, the extension part 832 may be formed by one or more extending metal layers of the predetermined number of metal layers configuring the porous bodies 830, 840. Also in this case, it is possible to accomplish the same effects as the exemplary embodiment.

Second Modified Embodiment of Exemplary Embodiment

In a second modified example of the exemplary embodiment, an example in which a plurality of extension parts is aligned side by side in the connection region is described. In the meantime, in the second modified example of the exemplary embodiment, the descriptions of the same configurations as the exemplary embodiment may be omitted.

Figure 10A:
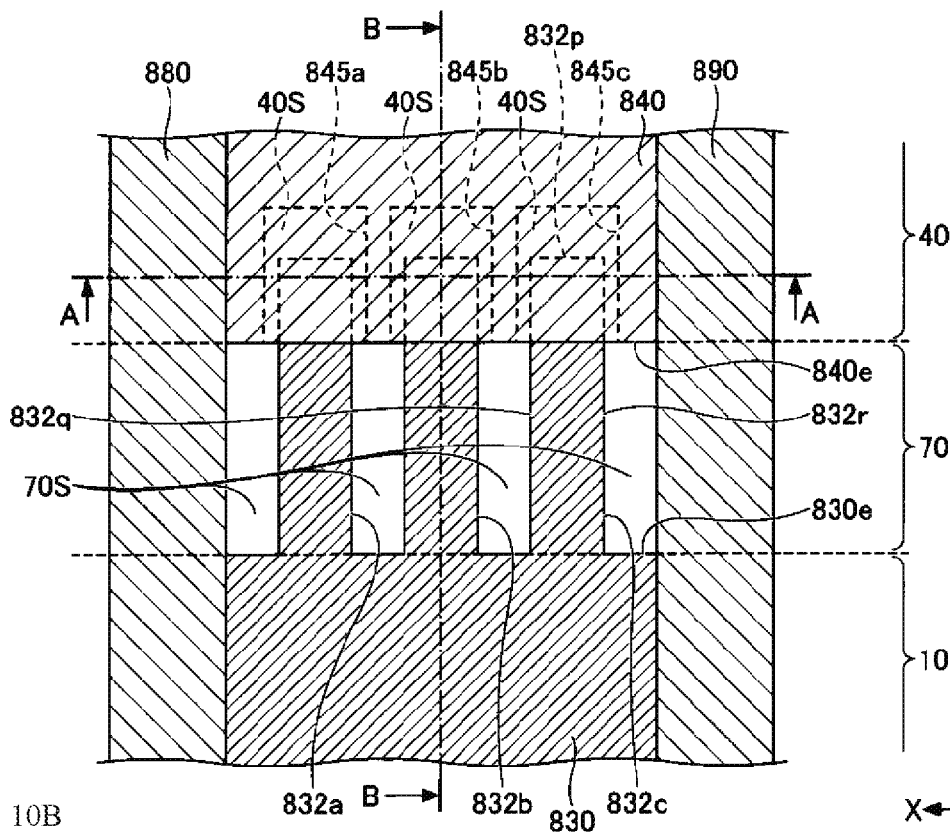
FIGS. 10A to 10C illustrate a structure of a connection region between an evaporator and a liquid pipe of a loop-type heat pipe in accordance with a second modified example of the exemplary embodiment.
Figure 10B:
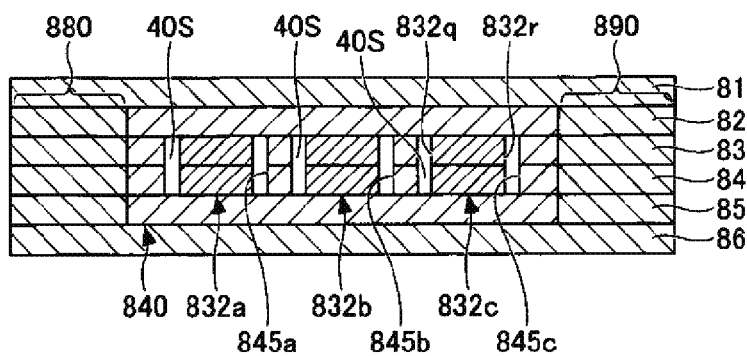
Figure 10C:
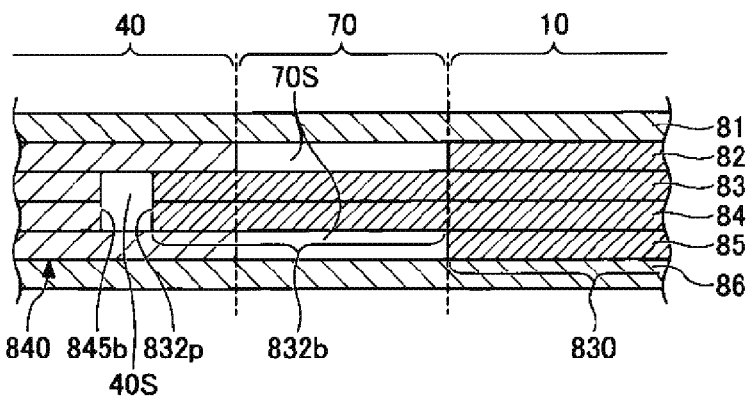

FIG. 10A illustrates a structure of a connection region between an evaporator and a liquid pipe of a loop-type heat pipe in accordance with the second modified example of the exemplary embodiment, and is a plan view corresponding to FIG. 3A. Also, FIG. 10B is a sectional view taken along a line A-A of FIG. 10A, and FIG. 10C is a sectional view taken along a line B-B of FIG. 10A. In the meantime, in FIG. 10A, the metal layers 81, 86, which are the outermost metal layers, are not shown. Also, although FIG. 10A is not a sectional view, the respective parts are hatched, in correspondence to FIGS. 10B and 10C, for convenience sake.

As shown in FIGS. 10A to 10C, in the second modified example of the exemplary embodiment, the connection region 70 has porous extension parts 832a, 832b, 832c extending from the porous body 830. The porous extension parts 832a, 832b, 832c and the porous body 830 in the evaporator 10 have a comb shape, as seen from above, for example.

Also, the connection region 70 has the space part 70S in contact with parts of side surfaces 832q, 832r of the respective extension parts 832a, 832b, 832c, a part of the end portion of the porous body 830, and a part of the end portion of the porous body 840.

The extension parts 832a to 832c are formed of only the metal layers 83, 84. The extension parts 832a to 832c protrude in the Y direction (toward the liquid pipe 40) from an end portion of the porous body 830 facing toward the connection region 70, respectively, and are aligned side by side with predetermined intervals in the X direction, as seen from above.

The metal layers 83, 84 of the porous body 840 are provided with three concave parts 845a, 845b, 845c opening toward the connection region 70 and aligned side by side with predetermined intervals in the X direction. A leading end (which faces the liquid pipe 40) of the extension part 832a in the Y direction reaches the inside of the liquid pipe 40 beyond the connection region 70, and is inserted in the concave part 845a, as seen from above. Also, a leading end (which faces the liquid pipe 40) of the extension part 832b in the Y direction reaches the inside of the liquid pipe 40 beyond the connection region 70, and is inserted in the concave part 845b, as seen from above. Also, a leading end (which faces the liquid pipe 40) of the extension part 832c in the Y direction reaches the inside of the liquid pipe 40 beyond the connection region 70, and is inserted in the concave part 845c, as seen from above.

The leading end face 832p and side surfaces 832q, 832r of each of the extension parts 832a to 832c are not in contact with inner wall surfaces of the concave parts 845a to 845c. That is, the leading end face 832p and side surfaces 832q, 832r of each of the extension parts 832a to 832c are arranged to face the inner wall surface of each of the concave parts 845a to 845c with being spaced therefrom. The space part 40S is formed between the leading end face 832p and side surfaces 832q, 832r of each of the extension parts 832a to 832c and the inner wall surface of each of the concave parts 845a to 845c. The space part 40S is formed to communicate with the space part 70S. In the meantime, as shown in FIGS. 10B and 10C, upper surfaces of parts, which are inserted in the concave parts 845a to 845c, of the extension parts 832a to 832c are in contact with the lower surface of the metal layer 82, and lower surfaces of parts, which are inserted in the concave parts 845a to 845c, of the extension parts 832a to 832c are in contact with the upper surface of the metal layer 85.

In the meantime, like the case of FIG. 9A, the extension parts 832a to 832c may be formed of only the metal layers 82, 85, and the concave parts 845a to 845c may be formed in only the metal layers 82, 85. Also, like the case of FIG. 9B, the extension parts 832a to 832c may be formed of only the metal layers 82, 45, and the concave parts 845a to 845c may be formed in only the metal layers 82, 84. Also, like the case of FIG. 9C, the extension parts 832a to 832c may be formed of only the metal layers 82, 83, and the concave parts 845a to 845c may be formed in only the metal layers 82, 83. Also, like the case of FIG. 9D, the extension parts 832a to 832c may be formed of only the metal layers 84, 85, and the concave parts 845a to 845c may be formed in only the metal layers 84, 85. Alternatively, the extension parts 832a to 832c may be formed of one or three of the metal layers 82 to 85, and the concave parts 845a to 845c may be formed in only the metal layer forming the extension parts 832a to 832c.

In this way, the plurality of extension parts (for example, the extension parts 832a, 832b, 832c) may be aligned side by side in the connection region 70. When the plurality of extension parts is provided in the connection region 70, it is possible to achieve further improved effects, as compared to the exemplary embodiment in which one extension part is provided in the connection region 70.

That is, it is possible to further effectively guide the liquid-phase operating fluid C in the liquid pipe 40 to the evaporator 10 by the capillary force generated in the porous body configuring the extension parts 832a to 832c, so that it is possible to further improve the liquid introduction ability from the liquid pipe 40 into the evaporator 10. Also, it is possible to further improve the effects of suppressing the heat leak from the evaporator 10 and preventing the dry out.

In the meantime, the number of the extension parts to be aligned side by side in the connection region 70 is not limited to three, and may be two or four or more. Also, the respective extension parts may have different widths in the X direction and different lengths in the Y direction.

Third Modified Embodiment of Exemplary Embodiment

In a third modified example of the exemplary embodiment, an example in which the extension part is provided to even the porous body of the liquid pipe is described. In the meantime, in the third modified example of the exemplary embodiment, the descriptions of the same configurations as the exemplary embodiment may be omitted.

Figure 11A:
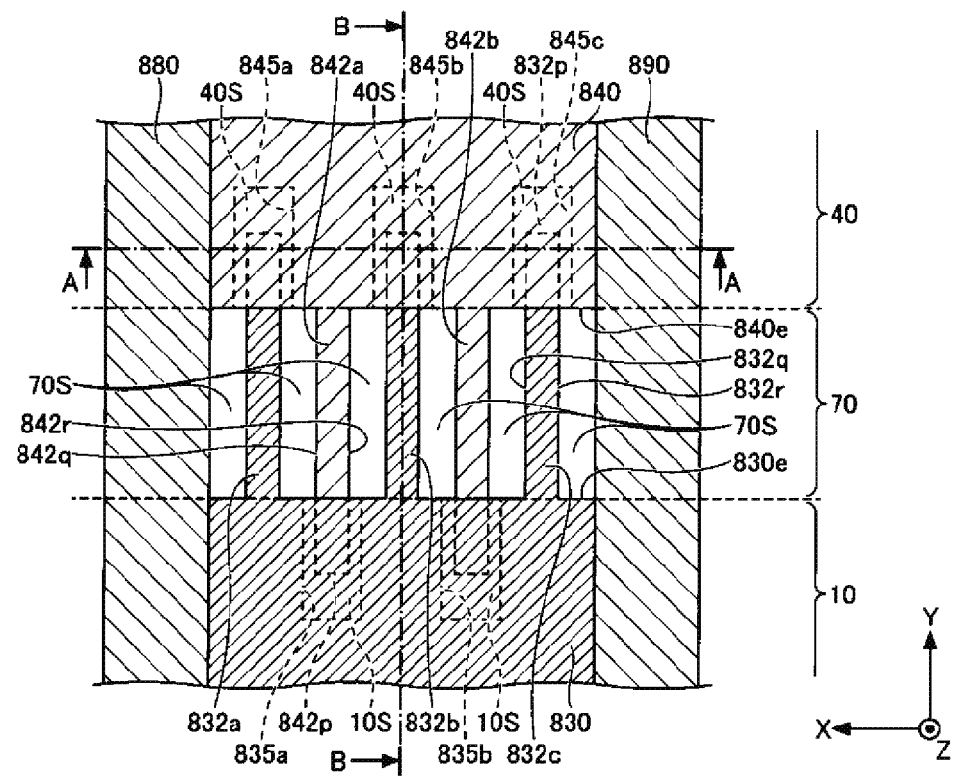
FIGS. 11A to 11C illustrate a structure of a connection region between an evaporator and a liquid pipe of a loop-type heat pipe in accordance with a third modified example of the exemplary embodiment.
Figure 11B:
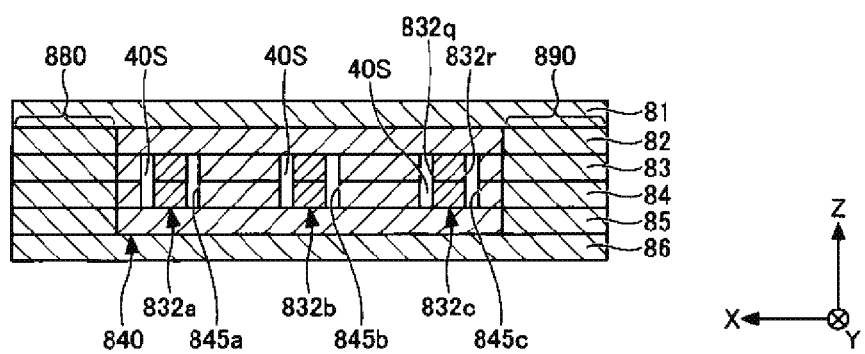
Figure 11C:
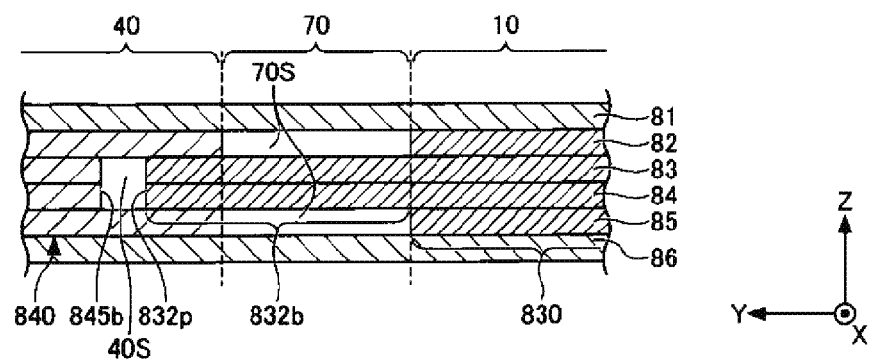

FIG. 11A illustrates a structure of a connection region between an evaporator and a liquid pipe of a loop-type heat pipe in accordance with the third modified example of the exemplary embodiment, and is a plan view corresponding to FIG. 3A. Also, FIG. 11B is a sectional view taken along a line A-A of FIG. 11A, and FIG. 11C is a sectional view taken along a line B-B of FIG. 11A. In the meantime, in FIG. 11A, the metal layers 81, 86, which are the outermost metal layers, are not shown. Also, although FIG. 11A is not a sectional view, the respective parts are hatched, in correspondence to FIGS. 11B and 11C, for convenience sake.

As shown in FIGS. 11A to 11C, in the third modified example of the exemplary embodiment, the connection region 70 has the porous extension parts 832a, 832b, 832c extending from the porous body 830 and the concave parts 845a, 845b, 845c formed in the porous body 840, like the second modified example of the exemplary embodiment. Also, the connection region 70 has porous extension parts 842a, 842b extending from the porous body 840 and concave parts 835a, 835b formed in the porous body 830, unlike the second modified example of the exemplary embodiment. The extension parts 832a, 832b, 832c, 842a, 842b, and a part of the end portion of the porous body 830, and a part of the end portion of the porous body 840 are in contact with the space part 70S.

The extension parts 832a, 832b, 832c extending from the porous body 830 and the extension parts 842a, 842b extending from the porous body 840 may be alternately arranged, as seen from above, for example. Thereby, it is possible to achieve two flow effects of advancing and moving the operating fluid through the porous body at the liquid pipe and sucking and moving the operating fluid through the porous body at the evaporator.

Specifically, for example, the extension parts 842a, 842b are formed of only the metal layers 83, 84. The extension parts 842a, 842b protrude in the Y direction (toward the evaporator 10) from the end portion of the porous body 840 facing toward the connection region 70, respectively, and are aligned side by side with a predetermined interval in the X direction, as seen from above. The extension parts 842a, 842b are provided integrally (continuously) with the porous body 840 in the liquid pipe 40.

The metal layers 83, 84 of the porous body 830 have two concave parts 835a, 835b opening toward the connection region 70 and aligned side by side with a predetermined interval in the X direction. The concave parts 835a, 835b are hollowed in the Y direction (toward the evaporator 10) from the connection region 70-side end face 830e of the porous body 830, as seen from above. A leading end (which faces the evaporator 10) of the extension part 842a in the Y direction reaches the inside of the evaporator 10 beyond the connection region 70, and is inserted in the concave part 835a, as seen from above. Also, a leading end (which faces the evaporator 10) of the extension part 842b in the Y direction reaches the inside of the evaporator 10 beyond the connection region 70, and is inserted in the concave part 835b, as seen from above.

A leading end face 842p and side surfaces 842q, 842r of each of the extension parts 842a, 842b are not in contact with the inner wall surface of each of the concave parts 835a, 835b. That is, the leading end face 832p and side surfaces 832q, 832r of each of the extension parts 842a, 842b are arranged to face the inner wall surface of each of the concave parts 835a, 835b with being spaced therefrom. A space part 10S is formed between the leading end face 842p and side surfaces 842q, 842r of each of the extension parts 842a, 842c and the inner wall surface of each of the concave parts 835a, 835b. The space part 10S is formed to communicate with the space part 70S. In the meantime, as shown in FIGS. 11B and 11C, upper surfaces of parts, which are inserted in the concave parts 835a, 835b, of the extension parts 842a, 842b are in contact with the lower surface of the metal layer 82, and lower surfaces of parts, which are inserted in the concave parts 835a, 835b, of the extension parts 842a, 842b are in contact with the upper surface of the metal layer 85.

In the meantime, like the case shown in FIG. 9A, the extension parts 832a to 832c, 842a, 842b may be formed of only the metal layers 82, 85, and the concave parts 845a to 845c, 835a, 835b may be formed in only the metal layers 82, 85. Also, like the case of FIG. 9B, the extension parts 832a to 832c, 842a, 842b may be formed of only the metal layers 82, 84, and the concave parts 845a to 845c, 835a, 835b may be formed in only the metal layers 82, 84. Also, like the case of FIG. 9C, the extension parts 832a to 832c, 842a, 842b may be formed of only the metal layers 82, 83, and the concave parts 845a to 845c, 835a, 835b may be formed in only the metal layers 82, 83. Also, like the case of FIG. 9D, the extension parts 832a to 832c, 842a, 842b may be formed of only the metal layers 84, 85, and the concave parts 845a to 845c, 835a, 835b may be formed in only the metal layers 84, 85. Alternatively, the extension parts 832a to 832c, 842a, 842b may be formed of one or three of the metal layers 82 to 85, and the concave parts 845a to 845c, 835a, 835b may be formed in only the metal layer forming the extension parts 832a to 832c, 842a, 842b.

In this way, the extension part (for example, the extension parts 832a, 832b, 832c) may be provided for the porous body 830 of the evaporator 10, and the extension part (for example, the extension parts 842a, 842b) may be further provided for the porous body 840 of the liquid pipe 40. In this case, since it is possible to increase the number of the extension parts to be provided in the connection region 70, as compared to the first modified example of the exemplary embodiment, it is possible to accomplish further improved effects than the first modified example of the exemplary embodiment.

That is, it is possible to further effectively guide the liquid-phase operating fluid C in the liquid pipe 40 to the evaporator 10 by the capillary force generated in the porous body configuring the extension parts 832a to 832c, 842a, 842b, so that it is possible to further improve the liquid introduction ability from the liquid pipe 40 into the evaporator 10. Also, it is possible to further improve the effect of preventing the dry out.

In the meantime, the number of the extension parts of the porous body 830, which are to be aligned side by side in the connection region 70, is not limited to three, and may be two or four or more. Also, the number of the extension parts of the porous body 840, which are to be aligned side by side in the connection region 70, is not limited to two, and may be three or more. Also, the respective extension parts may have different widths in the X direction and different lengths in the Y direction. The number of the concave parts can also be appropriately changed, depending on the number of the extension parts.

Fourth Modified Embodiment of Exemplary Embodiment

In a fourth modified example of the exemplary embodiment, an example in which the extension part of one porous body is not in contact with the other porous body is described. In the meantime, in the fourth modified example of the exemplary embodiment, the descriptions of the same configurations as the exemplary embodiment may be omitted.

Figure 12A:
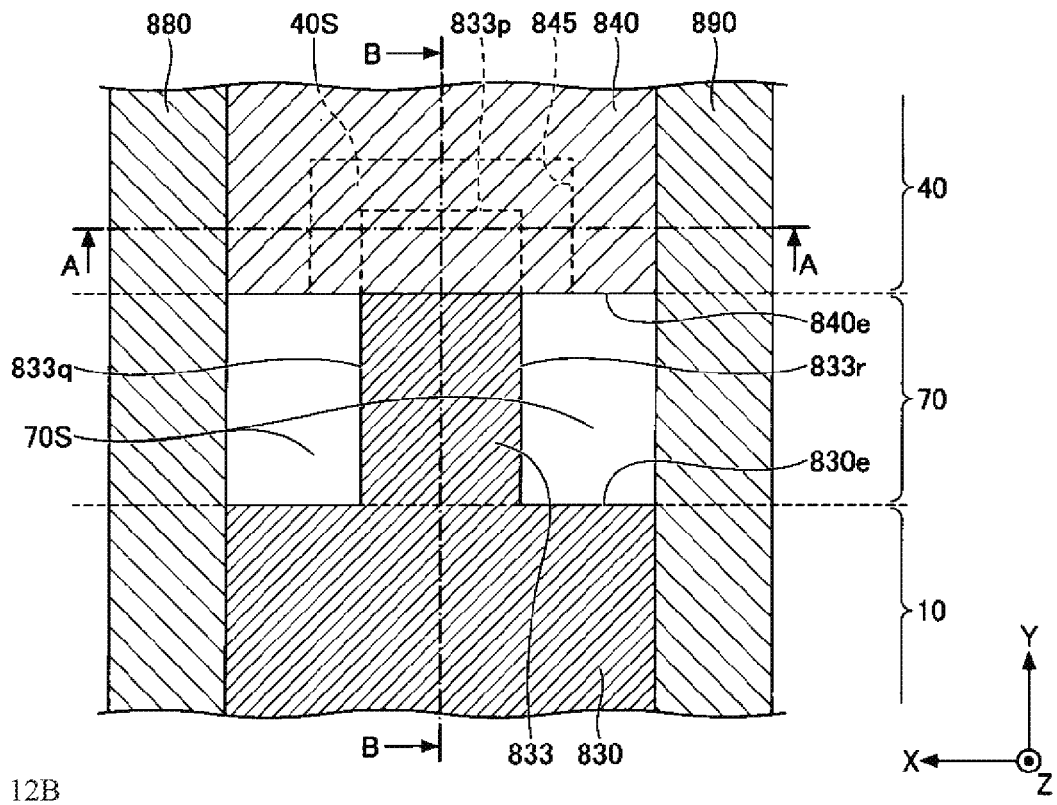
FIGS. 12A to 12C illustrate a structure of a connection region between an evaporator and a liquid pipe of a loop-type heat pipe in accordance with a fourth modified example of the exemplary embodiment.
Figure 12B:
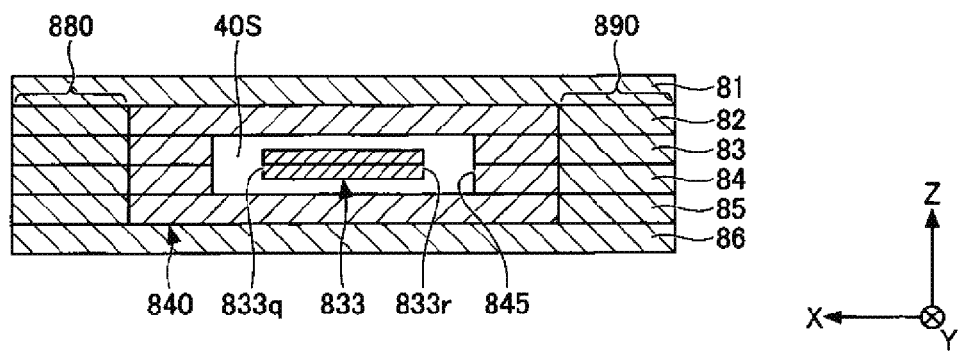
Figure 12C:
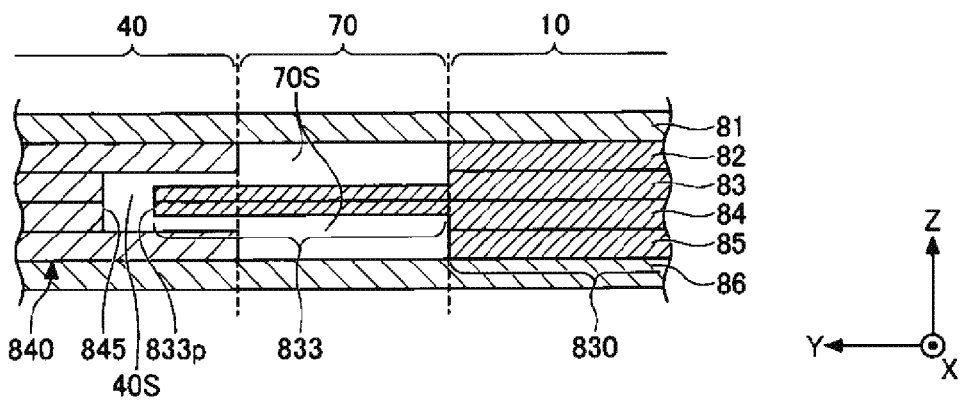

FIG. 12A illustrates a structure of a connection region between an evaporator and a liquid pipe of a loop-type heat pipe in accordance with the fourth modified example of the exemplary embodiment, and is a plan view corresponding to FIG. 3A. Also, FIG. 12B is a sectional view taken along a line A-A of FIG. 12A, and FIG. 12C is a sectional view taken along a line B-B of FIG. 12A. In the meantime, in FIG. 12A, the metal layers 81, 86, which are the outermost metal layers, are not shown. Also, although FIG. 12A is not a sectional view, the respective parts are hatched, in correspondence to FIGS. 12B and 12C, for convenience sake.

As shown in FIGS. 12A to 12C, in the fourth modified example of the exemplary embodiment, the connection region 70 has an extension part 833 extending from the porous body 830, and the space part 70S in contact with the extension part 833. The extension part 833 is formed of only the metal layers 83, 84, for example. The extension part 833 is provided integrally (continuously) with the porous body 830 in the evaporator 10. More specifically, the extension part 833 is provided integrally with the metal layers 83, 84 configuring the porous body 830 in the evaporator 10.

A part of the extension part 833 formed of the metal layer 83 is half-etched from the metal layer 82 and is thus thinned. Also, a part of the extension part 833 formed of the metal layer 84 is half-etched from the metal layer 85 and is thus thinned. As a result, the extension part 833 has about a half thickness of the extension part 832 (refer to FIGS. 8A to 8C and the like).

The concave part 845 is formed to penetrate the metal layers 83, 84 in the thickness direction.

A leading end (which faces a liquid pipe 40) of the extension part 833 in the Y direction reaches the inside of the liquid pipe 40 beyond the connection region 70 and is inserted in the concave part 845 formed in the porous body 840, as seen from above.

A leading end face 833p and side surfaces 833q, 833r of the extension part 833 are not in contact with the inner wall surface of the concave part 845. Upper and lower surfaces of the leading end portion of the extension part 833 are not also in contact with the concave part 845. That is, the leading end face 833p and side surfaces 833q, 833r of the extension part 833 are arranged to face the inner wall surface of the concave part 845 with being spaced therefrom. The upper surface of the leading end portion of the extension part 833 is arranged to face the lower surface of the metal layer 82 with being spaced therefrom, and the lower surface of the leading end portion of the extension part 833 is arranged to face the upper surface of the metal layer 85 with being spaced therefrom. The space part 40S is formed between the leading end face 833p, side surfaces 833q, 833r and upper and lower surfaces of the extension part 833 and the inner wall surface of the concave part 845. The space part 40S is formed to communicated with the space part 70S.

In the meantime, the extension part 833 may be formed of only the metal layer 82 thinned from the upper surface and the metal layer 83 thinned from the lower surface, and the concave part 845 may be formed in only the metal layers 82, 83. Also, the extension part 833 may be formed of only the metal layer 84 thinned from the upper surface and the metal layer 85 thinned from the lower surface, and the concave part 845 may be formed in only the metal layers 84, 85.

Also, the extension part 833 may be formed of only the metal layer 82 thinned from the upper surface or the metal layer 83 thinned from the lower surface, and the concave part 845 may be formed in only the metal layers 82, 83. Also, the extension part 833 may be formed of only the metal layer 83 thinned from the upper surface or the metal layer 83 thinned from the lower surface, and the concave part 845 may be formed in only the metal layers 83, 84. Also, the extension part 833 may be formed of only the metal layer 84 thinned from the upper surface and the metal layer 85 thinned from the lower surface, and the concave part 845 may be formed in only the metal layers 84, 85.

Also, the extension part 833 may be formed of only the metal layer 82 thinned from the upper surface, the metal layer 83 not thinned and the metal layer 84 thinned from the lower surface, and the concave part 845 may be formed in only the metal layers 82, 83, 84. Also, the extension part 833 may be formed of only the metal layer 83 thinned from the upper surface, the metal layer 84 not thinned and the metal layer 85 thinned from the lower surface, and the concave part 845 may be formed in only the metal layers 83, 84, 85.

In this way, the extension part of one porous body may be formed not to be in contact with the other porous body. Also in this case, it is possible to achieve the same effects as the exemplary embodiment. In addition to the effects of the exemplary embodiment, it is possible to achieve an effect of reducing an amount of the heat leak because the porous body of the evaporator is not in contact with the porous body of the liquid pipe and a heat transfer area can be thus reduced. In the meantime, this applies to a case where the porous body 830 has the plurality of extension parts and a case where the porous body 840 has one or more extension parts, too.

Fifth Modified Embodiment of Exemplary Embodiment

In a fifth modified example of the exemplary embodiment, an example in which only the porous body of the liquid pipe is provided with the extension part is described. In the meantime, in the fifth modified example of the exemplary embodiment, the descriptions of the same configurations as the exemplary embodiment may be omitted.

Figure 13A:
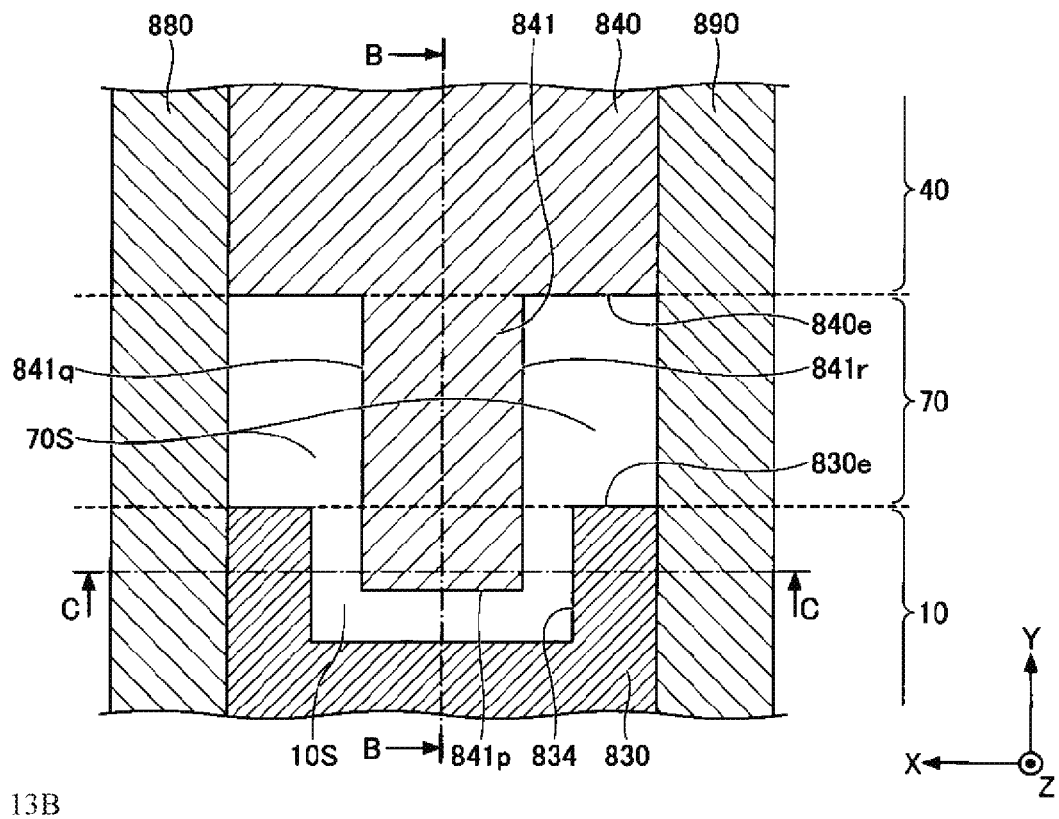
FIGS. 13A to 13C illustrate a structure of a connection region between an evaporator and a liquid pipe of a loop-type heat pipe in accordance with a fifth modified example of the exemplary embodiment.
Figure 13B:
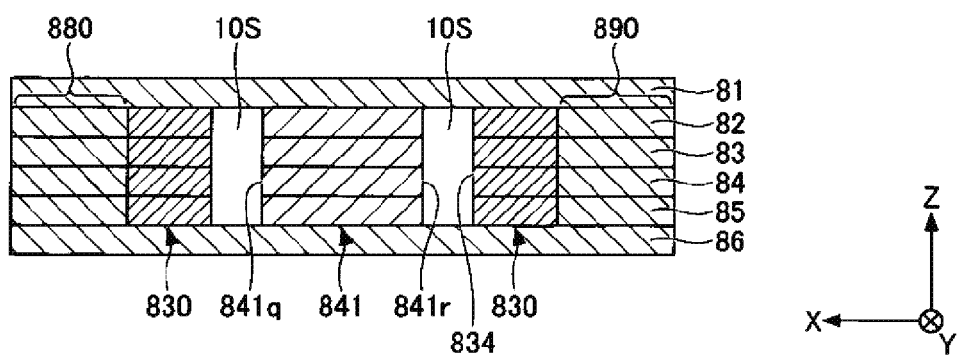
Figure 13C:
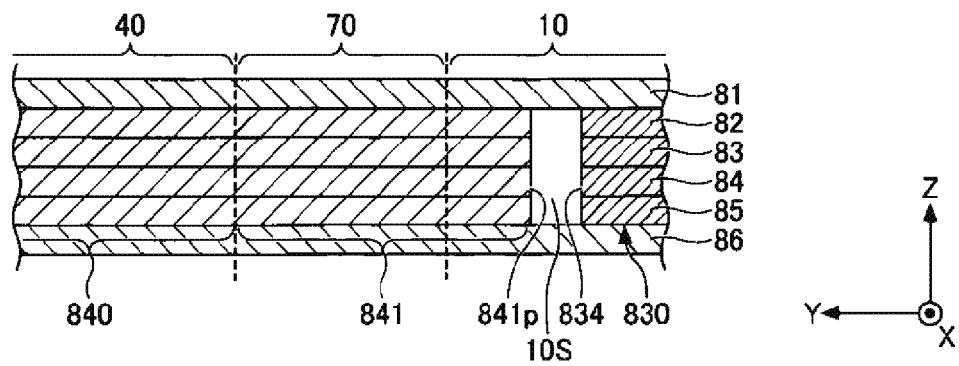

FIG. 13A illustrates a structure of a connection region between an evaporator and a liquid pipe of a loop-type heat pipe in accordance with the fifth modified example of the exemplary embodiment, and is a plan view corresponding to FIG. 3A. Also, FIG. 13B is a sectional view taken along a line C-C of FIG. 13A, and FIG. 13C is a sectional view taken along a line B-B of FIG. 13A. In the meantime, in FIG. 13A, the metal layers 81, 86, which are the outermost metal layers, are not shown. Also, although FIG. 13A is not a sectional view, the respective parts are hatched, in correspondence to FIGS. 13B and 13C, for convenience sake.

As shown in FIGS. 13A to 13C, in the fifth modified example of the exemplary embodiment, the evaporator 10 is provided therein with the porous body 830 and the space part 10S, and the liquid pipe 40 is provided therein with the porous body 840. Also, the connection region 70 between the evaporator 10 and the liquid pipe 40 is provided therein with a porous extension part 841 and the space part 70S.

Also, the connection region 70 has the space part 70S in contact with parts of side surfaces 841*q*, 841*r* of the extension part 841 and a part of the end portion of the porous body 840.

The porous extension part 841 protrudes in the Y direction (toward the evaporator 10) from a central part of an end face 840*e* (which faces the connection region 70) of the porous body 840 in the X direction, as seen from above.

The porous extension part 841 is provided integrally (continuously) with the porous body 840 in the liquid pipe 40. Also, the porous extension part 841 and the porous body 840 are made of the same material. The porous extension part 841 and the porous body 840 in the liquid pipe 40 form a convex shape, for example, as seen from above.

An end portion, which faces toward the liquid pipe 40, of the porous body 840 provided in the evaporator 10 has a concave part 834. More specifically, the concave part 834 is hollowed in the Y direction (toward the evaporator 10) from a central part of the end face 830*e* (which faces the connection region 70) of the porous body 830 in the X direction, as seen from above.

The porous bodies 830, 840 includes the four stacked metal layers (metal layers 82 to 85), and the extension part 841 includes the four metal layers (metal layers 82 to 85), which are stacked in the same manner as the porous bodies 830, 840. That is, the extension part 841 is formed as the four metal layers (metal layers 82 to 85) extend, and has the same porous structure as the porous bodies 830, 840. Also, the concave part 834 includes the four metal layers (metal layers 82 to 85), which are stacked in the same manner as the porous bodies 830, 840. That is, the concave part 834 is formed as the four metal layers (the metal layers 82 to 85) are hollowed, and has the same porous structure as the porous bodies 830, 840.

A leading end (which faces the evaporator 10) of the extension part 841 in the Y direction reaches the inside of the liquid pipe 40 beyond the connection region 70, and is inserted in the concave part 834 formed in the porous body 830, as seen from above.

A leading end face 841*p* and side surfaces 841*q*, 841*r* of the extension part 841 are not in contact with an inner wall surface of the concave part 834. That is, the leading end face 841*p* and side surfaces 841*q*, 841*r* of the extension part 841 are arranged to face the inner wall surface of the concave part 834 with being spaced therefrom. The space part 10S is formed between the leading end face 841*p* and side surfaces 841*q*, 841*r* of the extension part 841 and the inner wall surface of the concave part 844. The space part 10S is formed to communicate with the space part 70S. In the meantime, as shown in FIGS. 13B and 13C, an upper surface of the extension part 841 is in contact with the lower surface of the metal layer 81, and a lower surface of the extension part 841 is in contact with the upper surface of the metal layer 86.

In this way, the porous body 840 of the liquid pipe 40 may be provided with the extension part 841. Also in this case, it is possible to achieve the same effects as the exemplary embodiment.

In the meantime, the extension part 841 of the porous body 840 may be formed of one to three of the metal layers 82 to 85, and the concave part 834 may be formed in only the metal layer forming the extension part 841. Also, the number of the extension parts of the porous body 840 is not limited to one, and may be two or more. Also, when the number of the extension parts of the porous body 840 is two or more, the respective extension parts may have different widths in the X direction and different lengths in the Y direction.

Sixth Modified Embodiment of Exemplary Embodiment

In a sixth modified example of the exemplary embodiment, an example in which the leading end face of the extension part of one porous body is in contact with the concave part of the other porous body is described. In the meantime, in the sixth modified example of the exemplary embodiment, the descriptions of the same configurations as the exemplary embodiment may be omitted.

Figure 14:
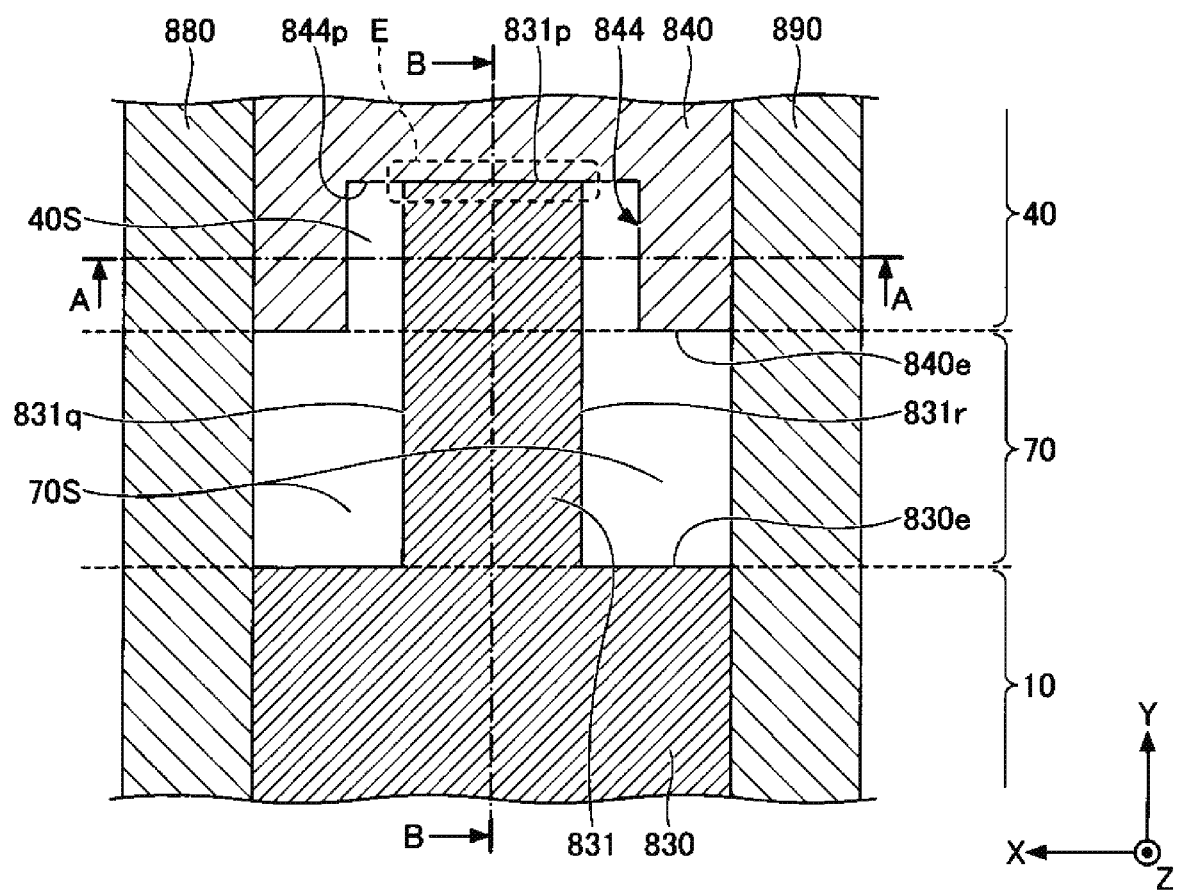
FIG. 14 illustrates a structure of a connection region between an evaporator and a liquid pipe of a loop-type heat pipe in accordance with a sixth modified example of the exemplary embodiment.

FIG. 14 illustrates a structure of a connection region between an evaporator and a liquid pipe of a loop-type heat pipe in accordance with the sixth modified example of the exemplary embodiment, and is a plan view corresponding to FIG. 3A. In the meantime, in FIG. 14, the metal layers 81, 86, which are the outermost metal layers, are not shown. Also, although FIG. 14 is not a sectional view, the respective parts are hatched, in correspondence to sectional views, for convenience sake. Also, since a sectional view taken along a line A-A of FIG. 14 is similar to FIG. 3B and a sectional view taken along a line B-B of FIG. 14 is similar to FIG. 3B, the corresponding sectional views are not shown.

As shown in an E part of FIG. 14, the sixth modified example of the exemplary embodiment is different from the exemplary embodiment (refer to FIGS. 3A to 3C), in that the leading end face 831p (which is substantially parallel with the XZ plane) of the extension part 831 is in contact with a surface 844p (which is substantially parallel with the XZ plane) of the inner wall surface of the concave part 844. The other configurations of the sixth modified example of the exemplary embodiment are the same as the exemplary embodiment (refer to FIGS. 3A to 3C).

In this way, the leading end face of the extension part of one porous body may be configured to be in contact with the concave part of the other porous body. In this case, it is possible to achieve an effect of improving mechanical strength in the vicinity of the connection region 70, in addition to the effects of the exemplary embodiment.

In the meantime, this sixth modified example can be applied to a case where the extension part of the porous body 830 and/or 840 is formed of one to three layers of the metal layers 82 to 85, too. Also, sixth modified example can be applied to a case where the number of the extension parts of the porous body 830 and/or 840 is two or more, too.

Although the preferred embodiments have been described, the present disclosure is not limited to the above embodiments, and can be diversely modified and replaced without departing from the claims.

For example, the fine pores of the porous body may be formed without communicating the bottomed holes each other, and the fine pores may be formed by stacking the metal layers having the through-holes formed therein so that the through-holes are to be partially overlapped.

What is claimed is:

1. A loop-type heat pipe comprising:
an evaporator configured to vaporize an operating fluid;
a condenser configured to condense the operating fluid;
a liquid pipe configured to connect the evaporator and the condenser;
a vapor pipe configured to connect the evaporator and the condenser and to form a loop together with the liquid pipe;
a first porous body provided in the evaporator; and
a second porous body provided in the liquid pipe,
wherein a connection region between the evaporator and the liquid pipe comprises:
a first extension part extending from the first porous body toward the second porous body, and
a space part in contact with the first extension part, and
wherein a leading end of the first extension part is inserted in a first concave part formed in the second porous body.

2. The loop-type heat pipe according to claim 1, wherein a plurality of the first extension parts is aligned side by side, as seen from above.

3. The loop-type heat pipe according to claim 1, wherein a leading end face of the first extension part is in contact with an inner wall surface of the first concave part.

4. The loop-type heat pipe according to claim 1, wherein the connection region comprises a second extension part extending from the second porous body toward the first porous body, and
wherein a leading end of the second extension part is inserted in a second concave part formed in the first porous body.

5. The loop-type heat pipe according to claim 4, wherein a plurality of the second extension parts is aligned side by side, as seen from above.

6. The loop-type heat pipe according to claim 5, wherein the first extension part and the second extension part are alternately arranged, as seen from above.

7. The loop-type heat pipe according to claim 4, wherein a leading end face of the second extension part is in contact with an inner wall surface of the second concave part.

8. The loop-type heat pipe according to claim 4, wherein the first porous body and the second porous body comprise a predetermined number of stacked metal layers, and
wherein the second extension part extends from one or more of the predetermined number of metal layers.

9. The loop-type heat pipe according to claim 1, wherein the first porous body and the second porous body comprise a predetermined number of stacked metal layers, and
wherein the first extension part extends from one or more of the predetermined number of metal layers.

10. The loop-type heat pipe according to claim 9, wherein at least one of the predetermined number of metal layers has first bottomed holes hollowed from one surface-side, second bottomed holes hollowed from the other surface-side, and fine pores formed as the first bottomed holes and the second bottomed hole partially communicate with each other.

11. A loop-type heat pipe comprising:
an evaporator configured to vaporize an operating fluid;
a condenser configured to condense the operating fluid;
a liquid pipe configured to connect the evaporator and the condenser;
a vapor pipe configured to connect the evaporator and the condenser and to form a loop together with the liquid pipe;
a first porous body provided in the evaporator; and
a second porous body provided in the liquid pipe,
wherein a connection region between the evaporator and the liquid pipe comprises:
a first extension part extending from the second porous body toward the first porous body, and
a space part in contact with the first extension part, and
wherein a leading end of the first extension part is inserted in a first concave part formed in the first porous body.

12. The loop-type heat pipe according to claim 11, wherein a plurality of the first extension parts is aligned side by side, as seen from above.

13. The loop-type heat pipe according to claim 11, wherein a leading end face of the first extension part is in contact with an inner wall surface of the first concave part.

14. The loop-type heat pipe according to claim 11, wherein the connection region comprises a second extension part extending from the first porous body toward the second porous body, and
wherein a leading end of the second extension part is inserted in a second concave part formed in the second porous body.

15. The loop-type heat pipe according to claim 14, wherein a plurality of the second extension parts is aligned side by side, as seen from above.

16. The loop-type heat pipe according to claim 15, wherein the first extension part and the second extension part are alternately arranged, as seen from above.

17. The loop-type heat pipe according to claim 14, wherein a leading end face of the second extension part is in contact with an inner wall surface of the second concave part.

18. The loop-type heat pipe according to claim 14, wherein the first porous body and the second porous body comprise a predetermined number of stacked metal layers, and
wherein the second extension part extends from one or more of the predetermined number of metal layers.

19. The loop-type heat pipe according to claim 11, wherein the first porous body and the second porous body comprise a predetermined number of stacked metal layers, and wherein the first extension part extends from one or more of the predetermined number of metal layers.

20. The loop-type heat pipe according to claim 19, wherein at least one of the predetermined number of metal layers has first bottomed holes hollowed from one surface-side, second bottomed holes hollowed from the other surface-side, and fine pores formed as the first bottomed holes and the second bottomed hole partially communicate with each other.

* * * * *